(12) United States Patent
Nakagawa et al.

(10) Patent No.: US 12,203,007 B2
(45) Date of Patent: *Jan. 21, 2025

(54) POLISHING LIQUID

(71) Applicant: HOYA CORPORATION, Tokyo (JP)

(72) Inventors: Hiroki Nakagawa, Akashi (JP); Kashio Nakayama, Hokuto (JP)

(73) Assignee: HOYA CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/384,061

(22) Filed: Jul. 23, 2021

(65) Prior Publication Data

US 2021/0348030 A1 Nov. 11, 2021

Related U.S. Application Data

(63) Continuation of application No. 16/337,310, filed as application No. PCT/JP2017/042278 on Nov. 24, 2017, now Pat. No. 11,098,224.

(30) Foreign Application Priority Data

Nov. 23, 2016 (JP) ................. 2016-227380
Nov. 23, 2016 (JP) ................. 2016-227381
Nov. 23, 2016 (JP) ................. 2016-227382

(51) Int. Cl.
| | | |
|---|---|---|
| C09G 1/02 | (2006.01) | |
| B24B 37/04 | (2012.01) | |
| C09K 3/14 | (2006.01) | |
| C23C 14/02 | (2006.01) | |
| C23C 14/34 | (2006.01) | |
| G11B 5/84 | (2006.01) | |

(52) U.S. Cl.
CPC .............. *C09G 1/02* (2013.01); *B24B 37/044* (2013.01); *C09K 3/1454* (2013.01); *C23C 14/028* (2013.01); *C23C 14/34* (2013.01); *G11B 5/8404* (2013.01)

(58) Field of Classification Search
None
See application file for complete search history.

(56) References Cited

U.S. PATENT DOCUMENTS

| | | | |
|---|---|---|---|
| 11,098,224 B2 * | 8/2021 | Nakagawa | ............ B24B 37/044 |
| 2003/0022502 A1 | 1/2003 | Matsui et al. | |
| 2004/0006924 A1 | 1/2004 | Scott et al. | |
| 2006/0038242 A1 | 2/2006 | Hsu et al. | |

(Continued)

FOREIGN PATENT DOCUMENTS

| | | |
|---|---|---|
| CN | 104137182 A | 11/2014 |
| CN | 105038698 A | 11/2015 |

(Continued)

OTHER PUBLICATIONS

International Search Report in PCT/JP2017/042278 dated Feb. 6, 2018.

(Continued)

*Primary Examiner* — Shamim Ahmed
(74) *Attorney, Agent, or Firm* — Global IP Counselors, LLP

(57) ABSTRACT

A polishing liquid for polishing a glass substrate includes cerium oxide as polishing abrasive particles, and a substance that reduces cerium oxide in response to irradiation of light.

9 Claims, 2 Drawing Sheets

(56) References Cited

U.S. PATENT DOCUMENTS

| | | | |
|---|---|---|---|
| 2006/0096179 A1* | 5/2006 | Lu ...................... | C09K 3/1445 51/307 |
| 2006/0234509 A1* | 10/2006 | Small ...................... | C09G 1/02 438/692 |
| 2009/0050897 A1 | 2/2009 | Watanabe | |
| 2011/0195638 A1 | 8/2011 | Sasaki et al. | |
| 2013/0084386 A1 | 4/2013 | Yamaguchi et al. | |
| 2013/0260027 A1* | 10/2013 | Iiizumi ................... | B24B 37/08 427/128 |
| 2014/0094032 A1 | 4/2014 | Yoshida et al. | |
| 2014/0154440 A1 | 6/2014 | Iida et al. | |
| 2014/0275374 A1 | 9/2014 | Shi et al. | |
| 2015/0290760 A1 | 10/2015 | Serikawa et al. | |
| 2016/0118073 A1 | 4/2016 | Tawara | |
| 2016/0319160 A1* | 11/2016 | Prevo ...................... | C09G 1/16 |
| 2020/0032104 A1 | 1/2020 | Nakagawa et al. | |

FOREIGN PATENT DOCUMENTS

| | | |
|---|---|---|
| CN | 105163906 A | 12/2015 |
| JP | 2000-063806 A | 2/2000 |
| JP | 2009-087441 A | 4/2009 |
| JP | 2009-215093 A | 9/2009 |
| JP | 6347907 B1 | 6/2018 |
| TW | I382893 B | 1/2013 |
| WO | 2007007683 A1 | 1/2007 |
| WO | 2012165376 A1 | 12/2012 |

OTHER PUBLICATIONS

Office Action translated into Japanese in the corresponding Chinese Patent Application No. 201780051993.7, dated Sep. 3, 2019.
Modified Substantive Examination Clear Report in the corresponding Malaysia Patent Application No. PI2019001392, dated Feb. 9, 2022.

* cited by examiner

POLISHING LIQUID

CROSS-REFERENCE TO RELATED APPLICATIONS

This is a continuation application of U.S. patent application Ser. No. 16/337,310, filed on Mar. 27, 2019, now U.S. Pat. No. 11,098,224, which is a U.S. National Stage Application of International Application No. PCT/JP2017/042278, filed on Nov. 24, 2017 which, in turn, claims priority to Japanese Patent Application No. 2016-227380, filed in Japan on Nov. 23, 2016, Japanese Patent Application No. 2016-227381, filed in Japan on Nov. 23, 2016, and Japanese Patent Application No. 2016-227382, filed in Japan on Nov. 23, 2016. The entire contents of U.S. patent application Ser. No. 16/337,310, International Application No. PCT/JP2017/042278, and Japanese Patent Application Nos. 2016-227380, 2016-227381, and 2016-227382 are hereby incorporated herein by reference.

BACKGROUND

Field of the Invention

The present invention relates to a method for polishing a glass substrate, a method for manufacturing a glass substrate, a method for manufacturing a magnetic-disk glass substrate, a method for manufacturing a magnetic disk, polishing liquid, and a method for reducing cerium oxide.

Background Information

Magnetic disks are one type of information recording media provided in magnetic recording apparatuses such as hard disk drives (HDDs). Magnetic disks are constituted by forming a thin film such as a magnetic film formed on a substrate, and an aluminum alloy substrate or a glass substrate has been used as the substrate. Recently, in response to the pursuit of high recording density, glass substrates with which the gap between the magnetic head and the magnetic disk can be made narrower than with aluminum substrates have been increasingly used. Also, the magnetic-disk substrate surfaces are precisely polished such that the flying height of the magnetic head can be lowered as much as possible to achieve a high recording density. In recent years, the demand for HDDs with a larger storage capacity has been increasing, and in order to achieve this, further quality improvement of magnetic-disk substrates is also required. Therefore, smoother and cleaner substrate surfaces are required.

As described above, it is essential for a magnetic disk to have a highly smooth surface to achieve the low flying height that is necessary for achieving a high recording density. In order to attain a highly smooth magnetic disk surface, a highly smooth substrate surface is ultimately required, and thus it is necessary to precisely polish the surface of the glass substrate.

As a conventional method, with regard to polishing, for example, JP 2000-63806A discloses an invention according to which when a magnetic-disk substrate made of aluminum is polished using a polishing agent slurry containing aluminum oxide abrasive particles, an inorganic salt selected from water-soluble inorganic aluminum salts and nickel salts, and a water-soluble chelating agent, an insoluble chelating salt produced by reaction with the above-described chelating agent is removed in advance and then the polishing agent slurry is used, as a result of which scratches are reduced.

SUMMARY

Conventionally, processing for polishing a main surface of a magnetic-disk substrate has been performed in a plurality of stages, for example, and in general, initial first polishing processing has been performed using cerium oxide as polishing abrasive particles, but according to the studies conducted by the inventor of the present invention, it was found that in the polishing processing using these cerium oxide abrasive particles, the polishing speed was low and the polishing speed during continuous polishing processing significantly decreased, which were obstacles to the realization of mass production of substrates having surfaces with increased quality. In general, in the processing for polishing a glass substrate, the initial first polishing processing has the largest amount of machining allowance in polishing processing with multiple stages, and thus the polishing speed is extremely important, and in order to perform continuous polishing processing, the polishing speed needs to be kept high for a long period of time.

The present invention was made in order to resolve such conventional issues, and an object thereof is to provide a method for polishing a glass substrate, by which a polishing speed that is higher than a conventional polishing speed can be achieved in processing for polishing a glass substrate using cerium oxide as polishing abrasive particles, and such a high polishing speed can be maintained for a long time of period. Also, an object thereof is to provide a method for manufacturing a glass substrate by which a high-quality glass substrate can be obtained using such a method for polishing a glass-substrate. In particular, an object thereof is to also provide a polishing method suitable for manufacturing a magnetic-disk glass substrate. Furthermore, an object thereof is to also provide a method for manufacturing a magnetic disk using a magnetic-disk glass substrate obtained using the above-described method for manufacturing a glass substrate. An object thereof is to also provide a polishing liquid suitable for a method for polishing a glass substrate of the present invention.

An object thereof is to also provide a method for reducing cerium oxide by which cerium oxide included as polishing abrasive particles in a polishing liquid can be efficiently reduced. Furthermore, an object thereof is to also provide a method for polishing a glass substrate, by which a polishing speed that is higher than a conventional polishing speed can be achieved using a polishing liquid containing cerium oxide reduced using such a method for reducing cerium oxide, and such a high polishing speed can be maintained for a long period of time.

In view of this, the inventor of the present invention searched for a means for resolving the above-described conventional issues, and as a result, the inventor found that the polishing speed can be increased due to a polishing liquid used in polishing processing using cerium oxide as polishing abrasive particles containing a substance that reduces cerium oxide in response to light irradiation, and thus a polishing speed that is higher than a conventional polishing speed was achieved. Also, the inventor found that such a high polishing speed was maintained for a long period of time.

Also, in this case, the inventor found that as a result of using, as polishing abrasive particles, cerium oxide whose surface has a substance that reduces cerium oxide in response to light irradiation, cerium oxide was efficiently reduced due to the above-described substance that reduces cerium oxide, and a polishing speed increase effect was also improved. Also, as a result of further conducting studies, the inventor of the present invention found that cerium oxide was efficiently reduced by, before performing such polishing processing, causing a polishing liquid containing cerium oxide abrasive particles to pass through a region in which the above-described substance that reduces cerium oxide in response to light irradiation is fixed, and causing cerium oxide abrasive particles to come into contact with the above-described reducing substance activated through light irradiation.

As a result of further conducting intensive studies based on the obtained findings, the inventor of the present invention accomplished the present invention. That is, the present invention has the following aspects.

(Aspect 1)
A polishing liquid for polishing a glass substrate, comprising cerium oxide as polishing abrasive particles, and a substance that reduces cerium oxide in response to irradiation of light.

(Aspect 2)
The polishing liquid according to Aspect 1, in which a band gap of the substance that reduces cerium oxide in response to the irradiation of the light is larger than a band gap of the cerium oxide.

(Aspect 3)
The polishing liquid according to Aspect 1, in which an energy level at a lower end of a conduction band of the substance that reduces cerium oxide in response to the irradiation of the light is higher than an energy level at a lower end of a conduction band of the cerium oxide.

(Aspect 4)
The polishing liquid according to Aspect 1, in which the substance that reduces cerium oxide in response to the irradiation of the light includes at least one of gallium oxide, tantalum oxide, tantalates, niobium oxide, and niobates.

(Aspect 5)
The polishing liquid according to Aspect 1, in which the polishing liquid is alkaline.

(Aspect 6)
A polishing liquid for polishing a glass substrate, comprising, as polishing abrasive particles, cerium oxide whose surface has a substance that reduces cerium oxide in response to irradiation of light.

(Aspect 7)
The polishing liquid according to Aspect 6, in which a band gap of the substance that reduces cerium oxide in response to the irradiation of the light is larger than a band gap of the cerium oxide.

(Aspect 8)
The polishing liquid according to Aspect 6, in which an energy level at a lower end of a conduction band of the substance that reduces cerium oxide in response to the irradiation of the light is higher than an energy level at a lower end of a conduction band of the cerium oxide.

(Aspect 9)
The polishing liquid according to Aspect 6, in which the substance that reduces cerium oxide in response to the irradiation of the light includes at least one of gallium oxide, tantalum oxide, tantalates, niobium oxide, and niobates.

(Aspect 10)
The polishing liquid according to Aspect 6, in which a coverage of the substance that reduces cerium oxide in response to the irradiation of the light on the surface of the cerium oxide is in a range of 0.01% to 50%.

(Aspect 11)
The polishing liquid according to Aspect 6, in which the polishing liquid is alkaline.

(Aspect 12) A carrier particle comprising a surface including a substance that reduces cerium oxide in response to irradiation of light and is attached to the surface, in which the carrier particle is used for reducing cerium oxide as polishing abrasive particles contained in a polishing liquid.

(Aspect 13)
The carrier particle according to Aspect 12, in which a coverage of the substance that reduces cerium oxide in response to the irradiation of the light on the surface of the carrier particle is 30% or more.

(Aspect 14)
The carrier particle according to Aspect 12, in which a band gap of the substance that reduces cerium oxide in response to the irradiation of the light is larger than a band gap of the cerium oxide.

(Aspect 15)
The carrier particle according to Aspect 12, in which an energy level at a lower end of a conduction band of the substance that reduces cerium oxide in response to the irradiation of the light is higher than an energy level at a lower end of a conduction band of the cerium oxide.

(Aspect 16)
The carrier particle according to Aspect 12, in which the substance that reduces cerium oxide in response to the irradiation of the light includes at least one of gallium oxide, tantalum oxide, tantalates, niobium oxide, and niobates.

(Aspect 17)
A method for reducing cerium oxide comprising reducing the cerium oxide as the polishing abrasive particles by irradiating the carrier particle according to Aspect 12 with the light, and by contacting the cerium oxide as the polishing abrasive particles with the carrier particle.

(Aspect 18)
A method for polishing a glass substrate, by which a glass substrate is subjected to polishing processing using the polishing liquid containing cerium oxide that has been reduced using the method for reducing cerium oxide according to Aspect 17.

(Aspect 19)
A method for manufacturing a glass substrate comprising processing in which a surface of a glass substrate is polished using the method for polishing a glass substrate according to Aspect 18.

(Aspect 20)
A method for manufacturing a magnetic-disk glass substrate, by which a magnetic-disk glass substrate is manufactured using the method for manufacturing a glass substrate according to Aspect 19.

BRIEF DESCRIPTION OF THE DRAWINGS

FIG. 5 is a schematic diagram illustrating band gaps and the like.

DESCRIPTION OF EMBODIMENTS

Figure 1:
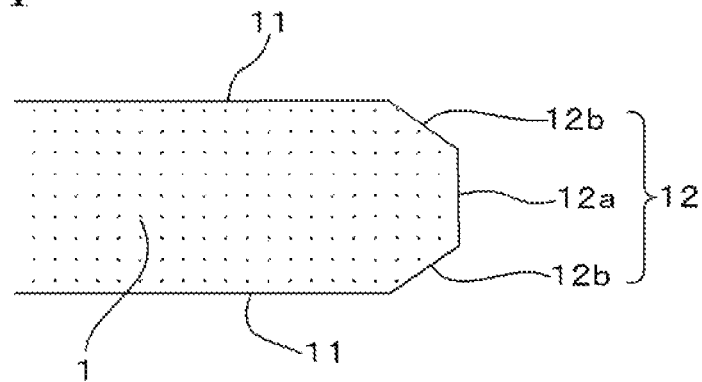
FIG. 1 is a cross-sectional view of a magnetic-disk glass substrate.

Hereinafter, embodiments according to the present invention will be described in detail.

First Embodiment

In the present embodiment, mainly, a magnetic-disk glass substrate that is suitable as a magnetic-disk substrate will be described.

The magnetic-disk glass substrate is generally manufactured through processes such as glass substrate molding, drilling processing, chamfering processing, grinding processing, edge surface polishing processing, and main surface polishing processing. Note that the order of processes is not limited to the above.

The magnetic-disk glass substrate is manufactured by first molding a disk-shaped glass substrate (glass disk) from molten glass through direct pressing. Note that, instead of using direct pressing, a glass substrate (glass disk) may be obtained by cutting plate glass manufactured using a down draw method or a float method to a predetermined size. Thereafter, drilling processing or chamfering processing is performed as appropriate to produce a disk-shaped glass substrate (glass disk) having a circular hole in the central portion.

Next, grinding processing for increasing dimensional accuracy and shape accuracy is performed on the above-described disk-shaped glass substrate (glass disk). In this grinding processing, in general, a double-side grinding apparatus is used to grind main surfaces of the glass substrate. By grinding the main surfaces of the glass substrate in this manner, the glass substrate is processed so as to have a predetermined substrate thickness and flatness and to obtain a predetermined surface roughness.

After this grinding processing is complete, edge surface polishing processing is performed through brushing or the like. Then, after this edge surface polishing processing is complete, main surface polishing processing for obtaining high precision main surfaces (mirror surfaces) is performed.

In the present invention, as a method for polishing surfaces of the glass substrate, polishing is performed using polishing pads made of polyurethane or the like while a polishing liquid containing cerium oxide as polishing abrasive particles is supplied. Note that "surfaces" of a glass substrate include both "main surfaces" and "edge surfaces" of a disk-shaped glass substrate. Note that, from the viewpoint of productivity and quality, it is suitable that edge surfaces are polished using a polish brush made of nylon or the like.

As described above, an aspect of the present invention is a method for polishing a glass substrate, by which the glass substrate is subjected to polishing processing using a polishing liquid containing cerium oxide as polishing abrasive particles, and this polishing liquid contains a substance that reduces cerium oxide in response to light irradiation, and the method includes processing for irradiating the polishing liquid with light when performing polishing processing.

The above-described polishing liquid used in such polishing processing is a combination of polishing abrasive particles and water that is a solvent, and further contains the substance that reduces cerium oxide in response to light irradiation in the present invention, and other additives are added as needed.

When preparing a polishing liquid containing cerium oxide abrasive particles, it is sufficient that pure water is used, for example, and cerium oxide abrasive particles, the above-described substance that reduces cerium oxide in response to light irradiation, and other additives are added as needed to prepare a polishing liquid.

In the present invention, from the viewpoint of polishing efficiency, it is preferable to use a polishing liquid containing cerium oxide abrasive particles having an average particle diameter of about 0.1 to 2.0 μm. In particular, it is preferable to use cerium oxide abrasive particles having an average particle diameter of about 0.8 to 1.3 μm.

Note that in the present invention, the above-described average particle diameter denotes a particle diameter at which a cumulative curve reaches 50% when the cumulative curve is obtained by setting the total volume of powder particles in the particle size distribution measured using a light scattering method to 100% (referred to as "cumulative average particle diameter (50% diameter)" hereinafter). In the present invention, specifically, the cumulative average particle diameter (50% diameter) can be measured using a particle diameter/particle size distribution measurement apparatus.

Also, although highly pure cerium oxide that contains no impurities can essentially be used as the above-described cerium oxide abrasive particles, cerium oxide abrasive particles preferably contain lanthanum (La) in the present invention. Using cerium oxide abrasive particles containing lanthanum (La) makes it possible to further increase the polishing speed. The content of lanthanum is expressed as the content of lanthanum oxide ($La_2O_3$) with respect to TREO (total rare-earth oxides: the amount of oxides of all of the rare earth elements in the polishing agent).

With regard to the content of lanthanum when cerium oxide abrasive particles contain lanthanum (La) in this manner, the content of lanthanum oxide ($La_2O_3$) with respect to TREO is preferably in a range of 1 to 50%, for example. Also, the content of lanthanum oxide with respect to TREO is more preferably in a range of 20 to 40%. If the content of lanthanum oxide ($La_2O_3$) is less than 1%, the effect of cerium oxide abrasive particles containing lanthanum (La) is not significantly obtained. Also, if the content of lanthanum oxide ($La_2O_3$) is greater than 50%, the cerium oxide component is relatively low, and the polishing speed may decrease.

Although there is no particular limitation on the content of the cerium oxide abrasive particles in the polishing liquid and the content can be adjusted as appropriate, from the viewpoint of the polishing speed and cost, the content can be preferably set to 1 to 20 wt %, for example. Note that the substance that reduces cerium oxide in the polishing liquid needs to be sufficiently activated through light irradiation in the present invention, and thus from the viewpoint of ensuring the length of light such as ultraviolet rays entering the polishing liquid (slurry), the content of cerium oxide abrasive particles in the polishing liquid is particularly preferably in a range of 1 to 10 wt %, for example.

Note that, if the cerium oxide abrasive particles contain lanthanum as described above, the content of cerium oxide abrasive particles in the polishing liquid is in a range that is similar to that above.

Also, in the present invention, cerium oxide is included as the main component of the polishing abrasive particles. In the present invention, the main component in polishing action on the surfaces of the glass substrate is cerium oxide, and a photocatalytic substance, which will be described later, is for assisting the polishing action of cerium oxide. Specifically, more than 50 wt % of the polishing abrasive particles included in the polishing liquid is preferably cerium oxide, 70 wt % or more of the polishing abrasive particles is more preferably cerium oxide, and 90 wt % or more of the polishing abrasive particles is most preferably cerium oxide.

In the present invention, the polishing liquid used in the above-described polishing processing contains a substance that reduces cerium oxide in response to light irradiation. More specifically, the substance that reduces cerium oxide in response to light irradiation is a substance that has photocatalytic activity capable of reducing cerium oxide abrasive particles in response to light irradiation. "In response to light irradiation" described above refers to "through light irradiation", for example. Note that, for the convenience of the description, the "substance that reduces cerium oxide in response to light irradiation" will be referred to as "a photocatalytic substance of the present invention" or simply referred to as "photocatalytic substance" hereinafter.

Examples of such a photocatalytic substance of the present invention include gallium oxide, tantalum oxide, tantalates, niobium oxide, niobates, and titanium oxide. Specific examples of these substances include $Ga_2O_3$, $Ta_2O_5$, $LiTaO_3$, $NaTaO_3$, $KTaO_3$, $Nb_2O_5$, $LiNbO_3$, $NaNbO_3$, $KNbO_3$, $(K_{0.5}Na_{0.5})NbO_3$, and $TiO_2$.

If titanium oxide is used, any one of three crystal forms of an anatase type, rutile type, and brookite type may be used. In particular, an anatase type and brookite type are preferable because these types of titanium oxide have high photocatalytic activity.

Also, from evaluation results, which will be described later, gallium oxide, tantalum oxide, tantalates, niobium oxide, and niobates out of the above-described photocatalytic substances are preferable. Also, tantalum oxide, tantalates, niobium oxide, and niobates are more preferable. Also, niobium oxide or niobates are even more preferable.

It is inferred that the reason as to why the above-described issues of the present invention can be resolved is due to a polishing liquid containing cerium oxide as polishing abrasive particles containing a photocatalytic substance of the present invention, that is, the reason as to why the polishing speed can be increased compared to a conventional polishing speed, and a polishing speed increase effect can be maintained for a long period of time is as follows.

The inventor of the present invention found that as the reason as to why glass substrates can be highly efficiently polished using cerium oxide as polishing abrasive particles, compared to polishing abrasive particles made of other materials, is because a chemical action of cerium oxide on the Si—O bond on the glass surface largely contributes to the polishing. That is, it is thought that, as a result of trivalent cerium ions (or trivalent cerium) in cerium oxide abrasive particles donating electrons (that is, reducing) to the Si—O bond of glass, the Si—O bond is weakened, and thus the polishing speed is increased. Thus, the inventor of the present invention found that, as a result of facilitating the chemical action (reducing action) of cerium oxide on glass surfaces, the above-described issues can be resolved.

Specifically, the photocatalytic substance of the present invention is added to a polishing liquid containing cerium oxide as polishing abrasive particles in advance, and if the polishing liquid containing this photocatalytic substance is irradiated with light having at least certain energy (the band gap of the photocatalytic substance or more) before polishing processing or when polishing processing is performed, electron excitation of the photocatalytic substance occurs and the photocatalytic substance is activated, an electron that is excited from the valence band to the conduction band is donated to cerium oxide, and thus cerium oxide is reduced. In short, cerium or cerium ions (tetravalent) that are present on the surface of cerium oxide are reduced to trivalent cerium or cerium ions. Also, as described above, trivalent cerium or cerium ions give electrons to Si—O of glass and weaken this bonding, and thus the polishing speed increases. As a result of increasing the ratio of trivalent cerium or cerium ions, a reducing action on glass is facilitated. Also, cerium oxide is continuously reduced by this photocatalytic substance through continuous light irradiation or through light irradiation a plurality of times.

As a result of reducing cerium oxide abrasive particles using the photocatalytic substance activated through light irradiation in this manner, cerium oxide can be highly efficiently reduced, and as a result, the reducing action on glass is also facilitated, the polishing speed is higher than a conventional polishing speed, a high polishing speed can be achieved, and this high polishing speed can be maintained for a long period of time.

Note that, when cerium oxide polishing abrasive particles are irradiated with light, electrons of cerium oxide included as polishing abrasive particles are also excited, but it is thought that these excited electrons will have little reducing action on glass. As a reason for this, it is inferred that, if electrons of cerium oxide are excited to a conduction band, holes are formed in a valence band, and thus the state of excited electrons is unstable, and the excited state has a short lifespan. On the other hand, it is thought that, as in the present invention, if electrons are donated to cerium oxide from another substance (that is, the photocatalytic substance of the present invention), cerium oxide can obtain electrons in a state in which the valence band of cerium oxide has no holes, and thus the excited state has a long lifespan (that is, the reducing action is strong).

Figure 5:
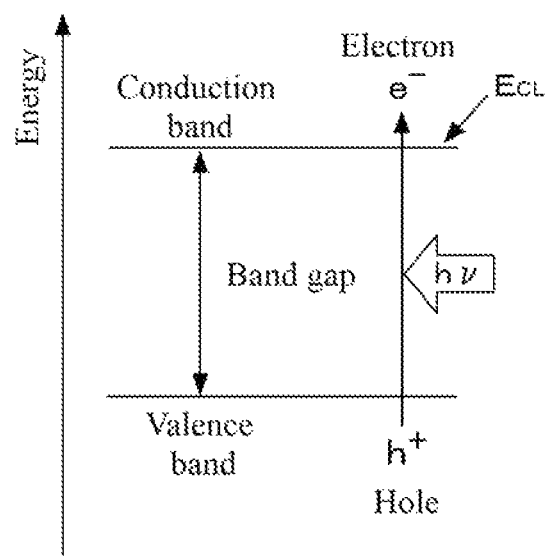

It is desirable that a band gap of the photocatalytic substance of the present invention is larger than a band gap of cerium oxide. As shown in FIG. 5, this band gap refers to a difference between energy levels of a valence band and a conduction band. When the photocatalytic substance is irradiated with light having energy that is larger than or equal to this band gap, electron excitation occurs, and electrons are excited from the valence band to the conduction band. As a result of the band gap of the photocatalytic substance of the present invention being larger than the band gap of cerium oxide, cerium oxide is efficiently reduced by the photocatalytic substance activated through light irradiation.

Also, it is desirable that the energy level at the lower end of the conduction band of the photocatalytic substance of the present invention is higher than the energy level at the lower end of the conduction band of cerium oxide. The energy level at the lower end of the conduction band herein refers to an "$E_{CL}$" shown in FIG. 5. The photocatalytic substance is activated through light irradiation, electrons excited from the valence band to the conduction band are donated to cerium oxide, cerium oxide is reduced, and when the energy level at the lower end of the conduction band of the photocatalytic substance of the present invention is higher than the energy level at the lower end of the conduction band of cerium oxide, excited electrons of the photocatalytic substance are efficiently donated to cerium oxide. As a result, the polishing speed tends to be increased.

Note that the above-described band gap and the energy level at the lower end of the conduction band can be measured using the following method.

[Evaluation of Band Gap]

A SolidSpec-3700 DUV UV-VIS-NIR spectrophotometer (manufactured by SHIMADZU CORPORATION) was used as an apparatus.

A reflectance was obtained through diffuse reflectance measurement of sample powder to be measured using an integrating sphere using $Ba_2SO_4$ as a reference. An obtained diffuse reflectance spectrum is subjected to Kubelka-Munk transformation, and the spectrum in Kubelka-Munk plots was calculated. A Kubelka-Munk function is $(1-R)^2/2R$ where the relative diffuse reflectance of a sample is R.

In order to obtain a band gap from this spectrum characteristic, the following equation is usually used.

$$(h\nu\alpha)^{1/n} = A(h\nu - E_g)$$

($h\nu$: energy of light, $\alpha$: absorption coefficient, $E_g$: band gap, A: constant)

In the case of direct transition, $n=\frac{1}{2}$ holds true, and in the case of indirect transition, $n=2$ holds true. In order to calculate a band gap of a direct transition-type photocatalyst, a tangent line is first drawn on the spectrum plotted with the horizontal axis $h\nu$ and the vertical axis $(h\nu\alpha)^2$ near the flexion point of a curve that corresponds to the rise in absorption. Next, a baseline is drawn on the longer wavelength side of the plot, and the energy at the intersection point is read to obtain the value of the band gap.

[Evaluation of Valence Band]

Apparatus: UPS (ultraviolet photoelectron spectroscopy) . . . Name: combined electron spectroscopic analyzer ESCA-5800 (manufactured by PHI)

Pre-treatment: powder of a measurement object was compacted into a metal foil to ensure conductivity. In order to correct Fermi levels between samples, gold was vapor-deposited on a portion of a measurement surface so as to have a thickness of about 10 nm.

A tangent line was drawn near a flexion point of a curve that corresponded to a rise in the obtained corrected UPS spectrum, the value at the point intersecting the horizontal axis was read, and the read value was regarded as a difference between the Fermi level ($E_f$) and the energy level at the upper end position of the valence band. From these results, the energy level at the upper end position of the valence band was determined.

[Evaluation of Conduction Band]

The position of the lower end of the conduction band was estimated by combining the band gap evaluation and the information regarding the position of the upper end of the valence band through UPS described above.

That is, from the evaluation result obtained through UPS, an energy difference between $E_f$ and the energy at the position of the upper end of the valence band of each substance was obtained, and a difference between the energy level at the position of the upper end of the valence band and the energy level at the position of the lower end of the conduction band is a band gap. Thus, as a result of combining both measurement results, the position of the lower end of the conduction band was estimated.

Herein, with regard to the photocatalytic substance described above as an example, the band gap measured using the above-described method and the value of the energy level at the lower end of the conduction band are collectively shown in Table 1. Also, measurement values of cerium oxide ($CeO_2$) are shown as a reference. Note that the value of the energy level at the lower end of the conduction band is a relative value with the value of cerium oxide used as a reference (=zero).

TABLE 1

| Substances | Band Gap (eV) | Energy Level at Lower End of Conduction Band (eV) |
|---|---|---|
| $CeO_2$ | 3.34 | 0 (Ref) |
| $TiO_2$ | 3.72 | −0.8 |
| $Ga_2O_3$ | 4.77 | −0.4 |
| $Ta_2O_5$ | 4.04 | +0.7 |
| $LiNbO_3$ | 4.20 | — |

As described above, in the present invention, the band gap of the photocatalytic substance is preferably larger than the band gap of cerium oxide. Also, the photocatalytic substance more preferably has a band gap of 4 eV or more. That is, in particular, $Ga_2O_3$, $Ta_2O_5$, and $LiNbO_3$ out of the photocatalytic substances described above as examples are preferable. In other words, gallium oxide, tantalum oxide, tantalates, niobium oxide, and niobates, which are photocatalytic substances, are more preferable.

Also, as described above, in the present invention, the energy level at the lower end of the conduction band of the photocatalytic substance is preferably higher than the energy level at the lower end of the conduction band of cerium oxide. From this point of view, $Ta_2O_5$ out of the photocatalytic substances described above as examples is particularly preferable.

Note that, although the energy level at the lower end of the conduction band of $LiNbO_3$ could not be estimated using the above-described method due to the occurrence of a charge-up phenomenon, $LiNbO_3$ had the best polishing speed increase effect (will be described later). Thus, the photocatalytic substances of niobium oxide or niobates are even more preferable.

The content (addition amount) of the photocatalytic substance in the polishing liquid is suitably in a range of 0.005 wt % to 30 wt %. If the content of the photocatalytic substance therein is less than 0.005 wt %, the functional effects of the present invention cannot be sufficiently obtained in some cases. On the other hand, if the content of the photocatalytic substance therein is more than 30 wt %, there is a risk that the photocatalytic substance will prevent contact between cerium oxide, made into polishing abrasive particles, and the glass surface, and the polishing speed will decrease in some cases. From a similar point of view, the content of the photocatalytic substance in the polishing liquid is preferably smaller than the content of the polishing agent. Specifically, the content of the photocatalytic substance in the polishing liquid is more preferably half or less of the content of the polishing agent, and even more preferably ⅕ or less of the content of the polishing agent. The content of the photocatalytic substance in the polishing liquid is more preferably in a range of 0.01 wt % to 10 wt %. Note that the upper limit of the content is more preferably 5 wt % or less, and even more preferably 3 wt % or less.

Also, an average particle diameter of the photocatalytic substance is preferable ⅕ or less, and more preferably 1/10 or less of an average particle diameter of cerium oxide included in the polishing liquid as the polishing agent at the same time. If the above-described value is larger than ⅕, there is a risk that polishing by cerium oxide will be inhibited, the polishing speed will decrease, and the surface quality after polishing will deteriorate (formation of a scratch and the like).

Also, it is preferable to use the polishing liquid containing the cerium oxide abrasive particles and the photocatalytic substance of the present invention in an alkaline condition. Use of the polishing liquid of the present invention in an alkaline condition makes it possible to prevent aggregation and precipitation of cerium oxide microparticles, which are the polishing abrasive particles, increase the polishing speed, and reduce polishing blemishes.

In the present invention, from the viewpoint of prevention of aggregation and precipitation of polishing abrasive particles and suppression of aggregation of the photocatalytic substance and uneven distribution of the photocatalytic substance in the polishing liquid, the pH of the polishing liquid is preferably in a range of 8 to 12. The pH of the polishing liquid is more preferably in a range of 9 to 11. The pH of the polishing liquid can be adjusted by adding an appropriate alkali agent or the like as needed.

In the present invention, although there is no particular limitation on the polishing method in the polishing processing, it is sufficient that in processing for polishing main surfaces of a glass substrate, for example, the main surfaces of the glass substrate are polished by bringing the glass substrate and the polishing pads into contact with each other, and moving the polishing pads and the glass substrate relative to each other while supplying the polishing liquid containing the above-described cerium oxide abrasive particles and the photocatalytic substance, for example.

Figure 3:
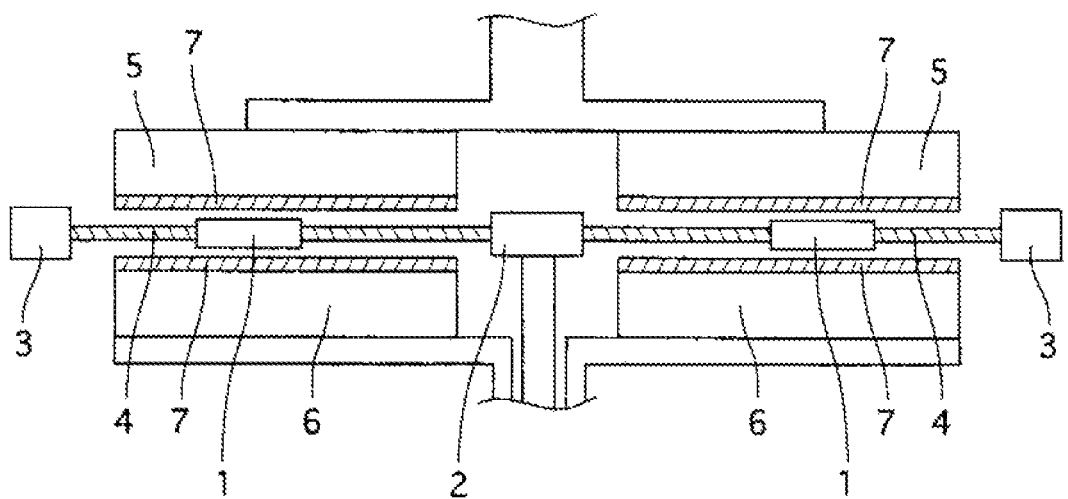
FIG. 3 is a longitudinal cross-sectional view of a schematic configuration of a double-side polishing apparatus.

For example, FIG. 3 is a longitudinal cross-sectional view of a schematic configuration of a planetary double-side polishing apparatus that can be used in the processing for polishing main surfaces of a glass substrate. The double-side polishing apparatus shown in FIG. 3 includes a sun gear 2, an internal gear 3 arranged concentrically on the outside of the sun gear 2, a carrier 4 that is engaged with the sun gear 2 and the internal gear 3 and revolves and rotates in response to the rotation of the sun gear 2 or the internal gear 3, an upper surface plate 5 and a lower surface plate 6 to which polishing pads 7 that are capable of holding a product 1 to be polished that is held by the carrier 4 are respectively attached, and a polishing liquid supply portion (not shown) that supplies the polishing liquid between the upper surface plate 5 and the lower surface plate 6.

At the time of polishing processing, by using such a double-side polishing apparatus, the product 1 to be polished, that is, the glass substrate held by the carrier 4 is held between the upper surface plate 5 and the lower surface plate 6, and both the upper and lower surfaces (main surfaces) of the product 1 to be polished are polished while the polishing liquid is supplied between the polishing pad 7 of the upper and lower surface plates 5 and 6 and the product 1 to be polished and the carrier 4 revolves and rotates in response to the rotation of the sun gear 2 and the internal gear 3. It is preferable to use a resin polisher (made of urethane foam or polyurethane foam) as the above-described polishing pad. Note that from the viewpoint of increasing the polishing speed, it is preferable to use a polishing pad having an Asker C hardness of 75 to 90. Also, from the viewpoint of suppression of minute blemishes caused by polishing, it is preferable to use a suede polishing pad.

Also, from the viewpoint of the polishing speed and the polishing quality, the load applied to the substrate during polishing is preferably in a range of 50 to 200 g/cm$^2$.

The present invention includes processing for irradiating the polishing liquid with light when performing polishing processing. This is for exciting and activating the photocatalytic substance of the present invention included in the polishing liquid. As described above, as a result of irradiating the photocatalytic substance with light having energy that is larger than or equal to the band gap, electron excitation occurs. Thus, the photocatalytic substance needs to be irradiated with light having a wavelength that is shorter than (light having energy that is larger than) that of light having energy corresponding to the band gap of the photocatalytic substance to be used. As shown in Table 1 above, although the value of a band gap changes depending on the substance, normally, it is desired that light having a wavelength of less than 350 nm is used. An ultraviolet lamp such as a xenon lamp, a (super) high pressure mercury-vapor lamp, a carbon-arc lamp, or a metal halide lamp can be used as a light source that emits light having such a wavelength.

As a timing of light irradiation, it is desired that light irradiation is performed before polishing processing is substantially started, and in order to achieve that, it is desired that the polishing liquid is irradiated with light before polishing processing or during polishing processing. For example, it is desired that the polishing liquid is irradiated with light immediately before the polishing liquid is introduced into the polishing apparatus. The irradiation time is preferably set to 1 second or more. The polishing liquid irradiated with light may be introduced into the polishing apparatus as soon as possible, and preferably within 30 seconds, and more preferably within 10 seconds, for example.

Although, when multiple substrates are subjected to continuous polishing processing, the polishing liquid is not replaced midway in the processing, and the polishing liquid is used while the polishing liquid is collected and the collected polishing liquid is circulated, according to the present invention, even if such continuous polishing processing is performed, the polishing speed can be increased from the beginning, and this effect can be maintained for a long period of time, and thus the present invention is suitable for a case where the polishing liquid is used while the polishing liquid is circulated as in continuous polishing processing.

Also, in the present invention, it is preferable to polish both surfaces of a plurality of substrates simultaneously through planetary gear movement by the carrier holding the plurality of substrates simultaneously. In particular, in one instance of polishing processing (one batch), the polishing processing is preferably performed on 10 or more substrates simultaneously, and more preferably on 50 or more substrates.

Note that in general, processing for polishing main surfaces of substrates is usually performed over two stages, namely, first polishing processing for removing blemishes and warping remaining from grinding processing so as to achieve predetermined smooth surfaces and second polishing processing for finishing the surface roughness of the main surfaces of the glass substrates into smooth mirror surfaces (however, there are cases where multi-stage polishing with three or more stages is performed), and in this case, it is preferable to apply the present invention to at least the first polishing processing, which is the preceding stage. In general, the first polishing processing has the largest amount of machining allowance among a plurality of types of polishing processing, and thus the polishing speed is very important. Note that from the viewpoint of reducing the machining allowance and increasing the productivity as much as possible, the surface roughness Ra of main surfaces of a glass substrate on which the first polishing processing is performed is preferably 100 nm or less. Similarly, from the viewpoint of reducing the machining allowance of the second polishing processing, the first polishing processing is preferably performed such that the surface roughness Ra of the main surfaces is 1.5 nm or less.

Also, in this case, finishing (precision) polishing processing (second polishing processing), which is performed in the latter stage, is preferably performed using a polishing liquid containing colloidal silica abrasive particles having an average particle diameter of about 10 to 100 nm, for example. In this case, from the viewpoint of increasing the polishing speed, it is appropriate to use a polishing liquid obtained by adjusting the pH to an acidic range. For example, the pH is preferably 5 or less, and more preferably 4 or less. Also, from the viewpoint of reducing an increase in the surface roughness caused by final cleaning, the pH is preferably 1 or more and more preferably 2 or more. Also, a polishing pad (suede pad) with a soft polisher is preferable as the polishing pad for this finishing polishing. The polishing method is similar to that above. Note that, from the viewpoint of further suppressing an increase in surface roughness in final cleaning, the polishing liquid used in the second polishing processing may be alkaline.

The polishing method of the present invention can be preferably applied to not only the processing for polishing main surfaces of a glass substrate but also processing for polishing edge surfaces of the glass substrate.

Next, processing for polishing edge surfaces of the glass substrate will be described.

In the edge surface polishing processing, an outer circumferential edge surface 12 (see FIGS. 1 and 2) of a glass substrate 1 is polished using a rotary brush (also referred to as "polishing brush"), for example. Note that a method for polishing chamfered surfaces and a side wall surface formed in an inner circumferential edge surface 13 of the glass substrate 1 is similar to that above, and thus description thereof is omitted.

The above-described rotary brush has a rotation axis perpendicular to front and back main surfaces 11 and 11 of the glass substrate 1 and brush hairs attached to an outer circumference of the rotation axis. The rotary brush polishes two chamfered surfaces 12b and 12b and a side wall surface 12a of an outer edge surface 12 of the glass substrate 1 using the brush hairs while rotating about the rotation axis.

The polishing liquid is supplied from a nozzle to a site of the glass substrate 1 to be polished using the rotary brush. The polishing liquid contains a polishing material, and in the case where the present invention is applied, cerium oxide abrasive particles are used as the polishing material. Also, this polishing liquid contains the above-described photocatalytic substance.

In the edge surface polishing processing, a plurality of glass substrates 1 may be stacked and polished all together. In this case, spacers may be disposed between the glass substrates 1. Also, the above-described rotary brush may swing in a direction in which the glass substrates 1 are stacked (a direction parallel to the center line of the rotation axis) while rotating about the rotation axis.

The supply amount of the polishing liquid that is supplied to a portion that is to be polished may be set in a range of 5 to 20 L/min, for example, the rotation speed of the rotary brush may be set in a range of 100 to 500 rpm, for example, the swing speed of the rotary brush in the rotation axis direction may be set in a range of 3 to 10 rpm (3 to 10 reciprocations in one minute), for example, and the rotation speed of the glass substrate (stacked body) may be set in a range of 50 to 100 rpm, for example, as appropriate.

In the edge surface polishing processing, it is also desired that the polishing liquid is irradiated with light before polishing processing or during polishing processing. For example, it is desired that the polishing liquid is irradiated with light immediately before the polishing liquid is introduced to the above-described portion that is to be polished.

Also, in the edge surface polishing processing, the present invention is suitable for a case where the polishing liquid is used while the polishing liquid is circulated without replacing the polishing liquid in the polishing processing.

Applying the present invention to the processing for polishing edge surfaces of a glass substrate as described above makes it possible to increase the polishing speed and maintain such a polishing speed increase effect for a long period of time, and this polishing speed increase effect is long-lasting.

In the present invention, the type of glass constituting the glass substrate is preferably aluminosilicate glass. Also, the type thereof is more preferably amorphous aluminosilicate glass. Mirror-polishing the surface of such a glass substrate can yield a smooth mirror-finished surface, and the post-processing strength is favorable. Aluminosilicate glass containing $SiO_2$ in an amount of 58 wt % or more and 75 wt % or less, $Al_2O_3$ in an amount of 5 wt % or more and 23 wt % or less, $Li_2O$ in an amount of 3 wt % or more and 10 wt % or less, and $Na_2O$ in an amount of 4 wt % or more and 13 wt % or less as main components can be used as such aluminosilicate glass.

Furthermore, it is possible to use amorphous aluminosilicate glass that contains $SiO_2$ in an amount of 62 wt % or more and 75 wt % or less, $Al_2O_3$ in an amount of 5 wt % or more and 15 wt % or less, $Li_2O$ in an amount of 4 wt % or more and 10 wt % or less, $Na_2O$ in an amount of 4 wt % or more and 12 wt % or less, and $ZrO_2$ in an amount of 5.5 wt % or more and 15 wt % or less as main components, and has an $Na_2O/ZrO_2$ weight ratio of 0.5 or more and 2.0 or less and an $Al_2O_3/ZrO_2$ weight ratio of 0.4 or more and 2.5 or less, for example.

In addition, there are cases in which heat resistance is required as a characteristic of a next-generation substrate. Such a glass substrate has a glass transition point (Tg) as high as 600° C. or more, for example. An example of the glass composition constituting such a glass substrate is as follows.

(Glass Composition 1)

Although there is no limitation on the composition of the glass substrate of the present embodiment, the glass substrate of the present embodiment is preferably amorphous aluminosilicate glass having an alkali-free glass composition containing, in terms of oxide amount in mass %, $SiO_2$ in an amount of 40 to 61%,
$Al_2O_3$ in an amount of 15% to 23.5%,
$MgO_2$ in an amount of 2 to 20%, and
CaO in an amount of 0.1 to 40%,
with $[SiO_2]+0.43\times[Al_2O_3]+0.59\times[CaO]-74.6\leq0$ and $[SiO_2]+0.21\times[MgO]+1.16\times[CaO]-83.0\leq0$ being satisfied.

The above-described brackets ([ ]) indicate the content (mass %) of a glass component shown in the brackets. Hereinafter, the above composition is also referred to as Glass Composition 1.

(Glass Composition 2)

Also, the following composition is an example of another preferred glass composition. That is, the example is amorphous aluminosilicate glass having a glass composition containing, in terms of oxide amount in mass %, $SiO_2$ in an amount of 64 to 72%,
$Al_2O_3$ in an amount of 17 to 22%,
MgO in an amount of 1 to 8%, and
CaO in an amount of 4 to 15.5%,
with $0.20\leq MgO/(MgO+CaO)\leq0.41$ being satisfied. Hereinafter, the above composition is also referred to as Glass Composition 2.

Although these glass substrates may contain alkali metal components ($Li_2O$, $Na_2O$, and $K_2O$), the content thereof is preferably small if the Tg needs to be high, and the glass substrate more preferably does not contain alkali metal components. Also, when glass contains alkali metal components, there is a concern that the alkali metal components will sometimes elute depending on the glass composition, but the elution risk can be reduced by reducing the content of the alkali metals or making the content thereof zero (alkali-free glass).

Note that, in order to be able to handle heat treatment when a next-generation magnetic film is formed, it is preferable to adjust the glass composition such that the glass transition point (Tg) is 600° C. or more. The glass transition point is more preferably 700° C. or more and even more preferably 750° C. In particular, when the glass transition point is 700° C. or more, the glass substrate can stand heat treatment at a very high temperature of 700° C., and thus the glass transition point is preferably 700° C. or more. Such a glass substrate is suitable as a glass substrate that is used for a magnetic disk for an energy-assisted magnetic recording method of assisting magnetization reversal during signal writing using heat, microwaves, or the like.

The present invention is particularly suitable for processing for polishing a heat resistant glass substrate having a high glass transition temperature (Tg) as described above. A heat resistant glass substrate having such a composition is preferable because such a heat resistance glass substrate contains relatively smaller amounts of oxides of alkali metals (Li, Na, K, and the like), compared to a conventionally used glass substrate, and has a better effect of suppressing a decrease in the polishing speed due to polishing processing to which a polishing liquid containing the cerium oxide abrasive particles and a photocatalytic substance of the present invention is applied being performed.

Note that in particular, the present invention is particularly suitable for polishing processing used to manufacture a magnetic-disk glass substrate, and can be applied to polishing processing used to manufacture glass for an optical lens, a glass substrate for a mask blank, and a glass substrate for a liquid crystal panel, and glass substrates for other various applications other than magnetic-disk glass substrates, for example.

In the present invention, an arithmetic average surface roughness Ra of a surface of a glass substrate after final polishing processing is preferably 0.20 nm or less, particularly preferably 0.15 nm or less, and more preferably 0.10 nm or less. Furthermore, the maximum roughness Rmax is preferably 2.0 nm or less, particularly preferably 1.5 nm or less, and more preferably 1.0 nm or less. Note that Ra and Rmax in the present invention refer to roughnesses calculated in conformity with Japanese Industrial Standard (JIS) B0601: 1982. Ra refers to an arithmetic average roughness, and Rmax refers to the maximum height. These surfaces are preferably mirror-surfaces.

Also, it is preferable in terms of practical application that the surface roughness in the present invention is the surface roughness of a surface shape that is measured using an atomic force microscope (AFM) in a 1 μm×1 μm range (a square region whose sides have a length of 1 μm) at a resolution of 256×256 pixels, for example. However, if Ra exceeds 50 nm, it is preferable to measure the surface roughness using a stylus type roughness tester.

In the present invention, chemical strengthening processing may be performed before or after the processing for polishing the main surfaces of the substrate. The glass substrate that has undergone the chemical strengthening processing has excellent impact resistance, and therefore it is particularly preferable to mount the glass substrate in an HDD for mobile use, for example. An alkali metal nitrate such as potassium nitrate or sodium nitrate can be preferably used as the chemical strengthening salt. For example, chemical strengthening processing can be performed by immersing a glass substrate in a chemical strengthening liquid, which is a molten salt of a mixture thereof.

Figure 2:
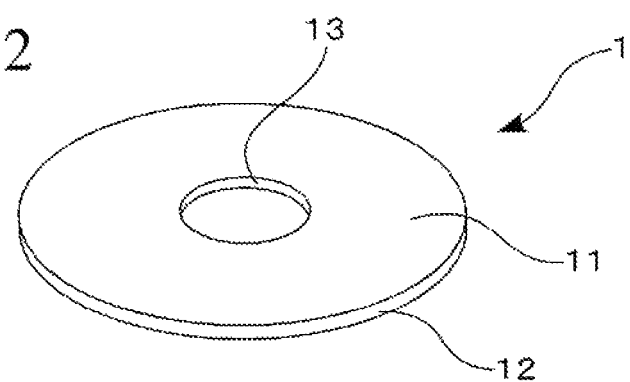
FIG. 2 is an overall perspective view of the magnetic-disk glass substrate.

As shown in FIGS. 1 and 2, a disk-shaped glass substrate 1 having both main surfaces 11 and 11 with an outer circumferential side edge surface 12 and an inner circumferential side edge surface 13 therebetween can be obtained by manufacturing a magnetic-disk glass substrate including polishing processing to which the method for polishing a glass substrate of the present invention is applied. The outer circumferential side edge surface 12 is constituted by a side wall surface 12a and chamfered surfaces 12b and 12b that are each located between a main surface and the side wall surface 12a. The inner circumferential side edge surface 13 also has a similar shape.

As described above, according to the present invention, in the processing for polishing a glass substrate using cerium oxide as polishing abrasive particles, it is possible to achieve a polishing speed that is higher than a conventional polishing speed and to maintain such a high polishing speed for a long period of time, and thus the present invention is suitable for a case where continuous polishing processing is performed without replacing the polishing liquid during processing, for example. In particular, the method for polishing a glass substrate of the present invention is suitable for processing for polishing a magnetic-disk glass substrate. Also, the magnetic-disk glass substrate obtained by the present invention has a high productivity and can be preferably used as, in particular, a next-generation substrate with stricter requirements on substrate surface quality than currently available substrates.

Also, the present invention provides a method for manufacturing a magnetic disk in which the above-described magnetic-disk glass substrate is used.

The magnetic disk is manufactured by forming at least a magnetic film on the magnetic-disk glass substrate obtained by the present invention. A hexagonal-system CoCrPt-based, CoPt-based, or FePt-based ferromagnetic alloy with a large anisotropic magnetic field can be used as a material of the magnetic layer. It is preferable to form the magnetic film using a sputtering method such as a DC magnetron sputtering method, for example.

Also, it is preferable to form a protective layer and a lubricant layer in this order on the magnetic film. An amorphous hydrogenated carbon-based protective layer is preferable as the protective layer. Also, as the lubricant layer, a lubricant containing a perfluoropolyether compound can be used. Even in the case where the magnetic-disk glass substrate obtained by the present invention is used in combination with a magnetic head that is provided with the DFH function and is designed to have a very low flying height, a highly reliable magnetic disk that is capable of performing stable operations for a long period of time can be obtained.

Second Embodiment

Next, a second embodiment of the present invention will be described. The present embodiment is a method for polishing a glass substrate, by which a glass substrate is subjected to polishing processing using a polishing liquid containing polishing abrasive particles, and this polishing liquid contains, as polishing abrasive particles, cerium oxide whose surface has a substance that reduces cerium oxide in response to light irradiation, and the method includes processing for irradiating the polishing liquid with light during polishing processing.

In the present embodiment, cerium oxide whose surface has a substance that reduces cerium oxide in response to light irradiation is added, as polishing abrasive particles, to a polishing liquid to be applied in the above-described polishing processing. The substance that reduces cerium oxide in response to light irradiation is similar to that of the first embodiment, and examples thereof include substances having a photocatalytic activity capable of reducing cerium oxide abrasive particles in response to light irradiation. Thus, in the present embodiment, the "substance that reduces cerium oxide in response to light irradiation" will also be referred to as "a photocatalytic substance of the present invention" or simply referred to as "photocatalytic substance" hereinafter.

Similarly to the first embodiment, examples of such a photocatalytic substance of the present invention include gallium oxide, tantalum oxide, tantalates, niobium oxide, niobates, and titanium oxide. Specific examples of these substances include $Ga_2O_3$, $Ta_2O_5$, $LiTaO_3$, $NaTaO_3$, $KTaO_3$, $Nb_2O_5$, $LiNbO_3$, $NaNbO_3$, $KNbO_3$, $(K_{0.5}Na_{0.5})NbO_3$, and $TiO_2$. If titanium oxide is used, any one of three crystal forms of an anatase type, rutile type, and brookite type may be used. In particular, the anatase type and brookite type are preferable because these types of titanium oxide have high photocatalytic activity.

Although it is inferred that the reason as to why the above-described issues of the present invention can be resolved is due to a glass substrate being subjected to surface treatment using a polishing liquid containing, as polishing abrasive particles, cerium oxide whose surface has a photocatalytic substance of the present invention, that is, the reason as to why the polishing speed can be increased compared to a conventional polishing speed, and a polishing speed increase effect can be maintained for a long period of time is similar to that of the above-described first embodiment, in the present embodiment, in particular, surfaces of cerium oxide abrasive particles include a photocatalytic substance and the photocatalytic substance is in contact with the cerium oxide abrasive particle surfaces, and thus electrons efficiently move from the photocatalytic substance to cerium oxide, that is, a reducing action of the photocatalytic substance efficiently acts on cerium oxide, as a result a polishing speed increase effect is further improved.

Note that, if cerium oxide abrasive particles and a photocatalytic substance are separately present in the polishing liquid, it is possible that absorption of irradiation light by cerium oxide will inhibit absorption of irradiation light by the photocatalytic substance and activation of the photocatalytic substance because cerium oxide also absorbs irradiation light in response to light irradiation, as described above, in the present embodiment, the photocatalytic substance is present in contact with the cerium oxide abrasive particle surfaces, and thus irradiation light is preferentially absorbed by the photocatalytic substance rather than cerium oxide. Thus, in the present embodiment, inhibition of irradiation light absorption by the photocatalytic substance and the activation of the photocatalytic substance resulting from irradiation light absorption by cerium oxide is effectively suppressed, and in this regard as well, a reducing action of the photocatalytic substance efficiently acts on cerium oxide.

A band gap of the photocatalytic substance of the present invention is also desirably larger than a band gap of cerium oxide in the present embodiment because of a reason similar to that of the first embodiment. Also, it is desirable that the energy level at the lower end of the conduction band of the photocatalytic substance of the present invention is higher than the energy level at the lower end of the conduction band of cerium oxide.

Note that the above-described band gap, energy level at the lower end of the conduction band, and a method for measuring these values are the same as those described in the above-described embodiment. The band gaps and the energy levels at the lower ends of the conduction bands of the photocatalytic substances described as examples are shown in Table 1 described above.

Cerium oxide abrasive particles whose surfaces have the above-described photocatalytic substance can be manufactured as follows.

That is, a mixer provided with a mixing tank and members such as high-speed rotating blades is used, cerium oxide abrasive particles and the photocatalytic substance are introduced into and mixed in the mixing tank, and a shearing stress is applied, and thus cerium oxide abrasive particles and the photocatalytic substance strongly rub each other in the mixing tank. Blending amounts of cerium oxide abrasive particles and the photocatalytic substance in this case may be determined as appropriate in consideration of a coverage of the photocatalytic substance on the surface of cerium oxide and the like. In this manner, it is possible to obtain cerium oxide abrasive particles in a state in which the photocatalytic substance is attached to and is in contact with the cerium oxide abrasive particle surfaces. Of course, the manufacturing method is not necessarily limited to such a manufacturing method. The particle diameter of the photocatalytic substance is $1/10$ or less of the particle diameter of cerium oxide. If the particle diameter of the photocatalytic substance is larger than $1/10$ of the particle diameter of cerium oxide, there is a risk that a force by which the photocatalytic substance attaches to the surface of cerium oxide will decrease, and the photocatalytic substance will soon separate from the surface of the cerium oxide when cerium oxide abrasive particles are repeatedly used.

With cerium oxide abrasive particles whose surfaces have the photocatalytic substance of the present invention, a coverage of the photocatalytic substance on the surface of cerium oxide is in a range of 0.01% to 50%. If the coverage of the photocatalytic substance is less than 0.01%, the functional effects of the present invention are not sufficiently obtained in some cases. On the other hand, if the coverage of the photocatalytic substance is higher than 50%, the polishing speed decreases in some cases due to a decrease in the amount of contact between the glass surface and cerium oxide, which is the polishing abrasive particles. The coverage of the photocatalytic substance is more preferably in a range of 0.1% to 30%.

Note that the coverage of the photocatalytic substance can be evaluated through a structural analysis using XRD (X-ray Diffraction) and a content analysis, surface observation using an SEM (Scanning Electron Microscope), or appropriately using an analysis method such as elemental analysis using EDX (Energy Dispersive X-ray Spectroscopy) and element mapping. For example, it is possible to evaluate a ratio using a binarizing method through image processing using an element mapping image obtained by subjecting an image obtained by observing a surface using SEM to elemental analysis using EDX.

The above-described polishing liquid used in polishing processing of the present invention is a combination of polishing abrasive particles and water that is a solvent, and contains, as polishing abrasive particles, cerium oxide whose surface has the photocatalytic substance, and other additives are added as needed. When preparing a polishing liquid containing polishing abrasive particles, it is sufficient that pure water is used, for example, and cerium oxide abrasive particles whose surfaces have the photocatalytic substance, and other additives are added as needed to prepare a polishing liquid.

From the viewpoint of polishing efficiency, it is preferable to use cerium oxide abrasive particles whose surfaces have the photocatalytic substance and that have an average particle diameter of about 0.1 to 2.0 μm. In particular, it is preferable to use cerium oxide abrasive particles with an average particle diameter of about 0.8 to 1.3 μm.

Also, although highly pure cerium oxide that contains no impurities can essentially be used as cerium oxide abrasive particles whose surfaces have the photocatalytic substance, cerium oxide preferably contains lanthanum (La) in the present invention. Using cerium oxide abrasive particles containing lanthanum (La) makes it possible to further increase the polishing speed. The content of lanthanum is expressed as the content of lanthanum oxide ($La_2O_3$) with respect to TREO (total rare-earth oxides: the amount of oxides of all of the rare earth elements in the polishing agent).

With regard to the content of lanthanum when cerium oxide abrasive particles contain lanthanum (La) in this manner, the content of lanthanum oxide ($La_2O_3$) with respect to TREO is preferably in a range of 1 to 50%, for example. Also, the content of lanthanum oxide with respect to TREO is more preferably in a range of 20 to 40%. If the content of lanthanum oxide ($La_2O_3$) is less than 1%, the effect of cerium oxide abrasive particles containing lanthanum (La) is not significantly obtained. Also, if the content of lanthanum oxide ($La_2O_3$) is greater than 50%, the cerium oxide component is relatively low, and the polishing speed may decrease.

Although there is no particular limitation on the content of the cerium oxide abrasive particles whose surfaces have the photocatalytic substance in the polishing liquid and the content can be adjusted as appropriate, from the viewpoint of the polishing speed and cost, the content thereof can be preferably set to 1 to 20 wt %, for example.

Note that, if the cerium oxide abrasive particles contain lanthanum as described above, the content of cerium oxide abrasive particles in the polishing liquid is in a range that is similar to that above.

Also, in the present invention, cerium oxide whose surface has a photocatalytic substance is included in the polishing abrasive particles as the main component. Specifically, more than 50 wt % of the polishing abrasive particles included in the polishing liquid is preferably the cerium oxide, 70 wt % or more of the polishing abrasive particles is more preferably the cerium oxide, and 90 wt % or more of the polishing abrasive particles is most preferably the cerium oxide.

Also, it is preferable to use the polishing liquid containing cerium oxide abrasive particles whose surfaces have the photocatalytic substance of the present invention in an alkaline condition. Use of the polishing liquid of the present invention in an alkaline condition makes it possible to prevent aggregation and precipitation of the cerium oxide microparticles, which are polishing abrasive particles, increase the polishing speed, and reduce polishing blemishes. From the viewpoint of prevention of aggregation and precipitation of polishing abrasive particles and suppression of aggregation of the photocatalytic substance and uneven distribution of the photocatalytic substance in the polishing liquid, the pH of the polishing liquid is preferably in a range of 8 to 12. The pH of the polishing liquid is more preferably in a range of 9 to 11. The pH of the polishing liquid can be adjusted by adding an appropriate alkali agent or the like as needed.

The polishing method, polishing conditions, and the like in the polishing processing are similar to those of the above-described first embodiment.

The present embodiment also includes processing for irradiating the polishing liquid with light when performing polishing processing. This is for exciting and activating the photocatalytic substance of the present invention on the surfaces of the cerium oxide abrasive particles included in the polishing liquid. As described above, as a result of irradiating the photocatalytic substance with light having energy that is larger than or equal to the band gap, electron excitation occurs, and thus the photocatalytic substance needs to be irradiated with light having a wavelength that is shorter than (light having energy that is larger than) that of light having energy corresponding to the band gap of the photocatalytic substance to be used. Although the value of the band gap changes depending on the substance, normally, it is desired that light having a wavelength of less than 350 nm is used, and an ultraviolet lamp such as a xenon lamp, a (super) high pressure mercury-vapor lamp, a carbon-arc lamp, or a metal halide lamp can be used as a light source that emits light having such a wavelength.

As a timing of light irradiation, it is desired that light irradiation is performed before polishing processing is substantially started, and in order to achieve that, it is desired that the polishing liquid is irradiated with light before polishing processing or during polishing processing. For example, it is desired that the polishing liquid is irradiated with light immediately before the polishing liquid is introduced into the polishing apparatus. The irradiation time is preferably set to 1 second or more. The polishing liquid irradiated with light may be introduced into the polishing apparatus as soon as possible, and preferably within 30 seconds, and more preferably within 10 seconds, for example.

Although, when multiple substrates are subjected to continuous polishing processing, the polishing liquid is not replaced midway in the processing, and the polishing liquid is used while the polishing liquid is collected and the collected polishing liquid is circulated, according to the present invention, even if such continuous polishing processing is performed, the polishing speed can be increased from the beginning, and this effect can be maintained for a long period of time, and thus the present invention is suitable for a case where the polishing liquid is used while the polishing liquid is circulated as in continuous polishing processing.

Note that in general, processing for polishing main surfaces of substrates is usually performed over two stages, namely, first polishing processing for removing blemishes and warping remaining from grinding processing so as to achieve predetermined smooth surfaces and second polishing processing for finishing the surface roughness of the main surfaces of the glass substrates into smooth mirror surfaces (however, there are cases where multi-stage polishing with three or more stages is performed), and in this case, it is preferable to apply the present embodiment to at least the first polishing processing, which is the preceding stage. Also, finishing (precision) polishing processing (second polishing processing), which is performed in the latter stage, is preferably performed using a polishing liquid containing colloidal silica abrasive particles having an average particle diameter of about 10 to 100 nm, for example, and details are the same as those described in the first embodiment.

The polishing method of the present embodiment can be preferably applied to not only the processing for polishing main surfaces of a glass substrate but also processing for polishing edge surfaces of the glass substrate. The processing for polishing edge surfaces of the glass substrate is the same as that described in the first embodiment, and thus will not be described herein.

Applying the present embodiment to the processing for polishing edge surfaces of a glass substrate makes it possible to increase the polishing speed and maintain such a polishing speed increase effect for a long period of time, and this polishing speed increase effect is long-lasting.

The glass substrate to be polished in the present embodiment is the same as that described in the first embodiment. The present embodiment is particularly suitable for processing for polishing a heat resistant glass substrate having a high glass transition temperature (Tg). The heat resistant glass substrate having such a composition is preferable because such a heat resistance glass substrate contains relatively smaller amounts of oxides of alkali metals (Li, Na, K, and the like), compared to a conventionally used glass substrate, and has a better effect of suppressing a decrease in the polishing speed caused by performing polishing processing to which a polishing liquid containing the cerium oxide abrasive particles whose surfaces have the photocatalytic substance of the present invention is applied.

As described above, according to the polishing method of the present embodiment, in the processing for polishing a glass substrate using, as polishing abrasive particles, cerium oxide whose surface has the photocatalytic substance, it is possible to achieve a polishing speed that is higher than a conventional polishing speed and to maintain such a high polishing speed for a long period of time, and thus the polishing method is suitable for a case where continuous polishing processing is performed without replacing the polishing liquid during processing, for example. In particular, the polishing method of the present embodiment is suitable for processing for polishing a magnetic-disk glass substrate.

Note that, although a detailed description of points similar to those of the above-described first embodiment is omitted in the second embodiment described above, the first embodiment may be applied similarly.

Third Embodiment

Next, a third embodiment of the present invention will be described. The present embodiment is a method for reducing cerium oxide included, as polishing abrasive particles, in a polishing liquid to be used when processing for polishing a glass substrate is performed, in which, as a result of the polishing liquid containing the cerium oxide passing through a region in which a substance that reduces cerium oxide in response to light irradiation is fixed and in which the substance that reduces cerium oxide is irradiated with light, the cerium oxide is reduced.

Also, the present embodiment is processing for polishing a glass substrate, by which a glass substrate is subjected to polishing processing using a polishing liquid containing cerium oxide that has been reduced using such a method for reducing cerium oxide.

Figure 4:
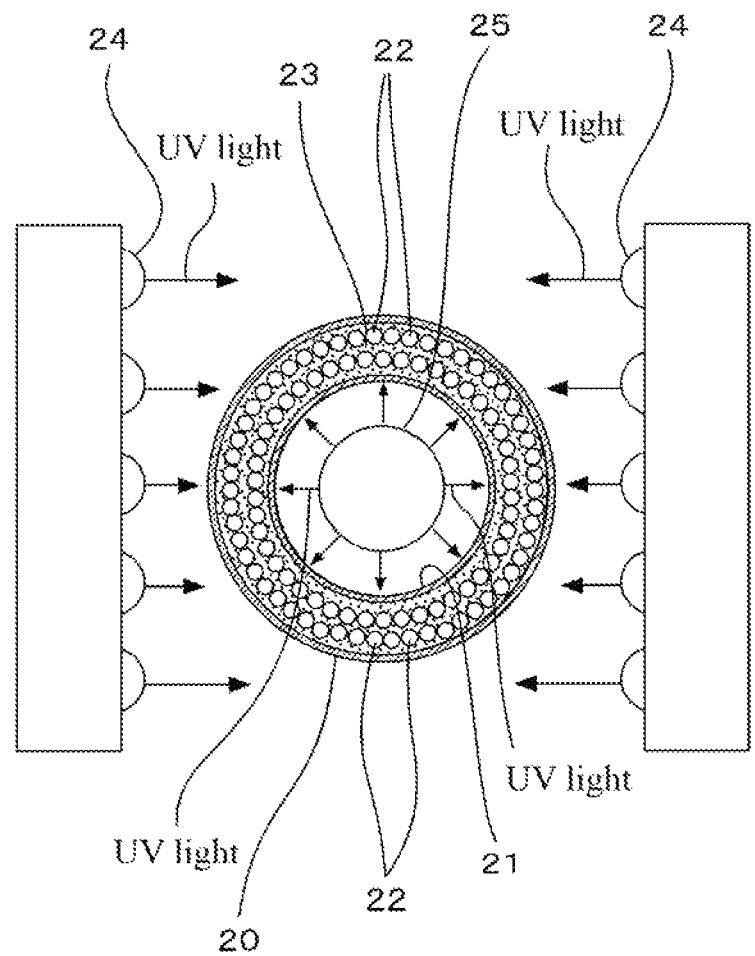
FIG. 4 is a schematic cross-sectional view showing one embodiment of a method for reducing cerium oxide of the present invention.

FIG. 4 is a schematic cross-sectional view showing one embodiment of a method for reducing cerium oxide of the present invention.

As shown in FIG. 4, two glass tubes 20 and 21 are disposed in a state in which the smaller glass tube 21 with a smaller diameter is inserted into the larger glass tube 20 with a larger diameter. In view of ultraviolet light transmission, it is preferable to use a quartz tube or the like as the glass tubes 20 and 21, for example.

Also, a substance 22 that reduces cerium oxide in response to particle-like light is fixed in a region (its gap is a difference between the diameter of the glass tube 20 and the diameter of the glass tube 21) formed between the glass tube 20 and the glass tube 21 in a state in which the region is filled with the substance 22. Note that, in this case, it is desired that the region is filled with the substance that reduces cerium oxide at a filling ratio to the extent that the substance does not freely move.

Also, light sources 24 configured to emit ultraviolet light (UV light) are disposed outside the glass tube 20, and a light source 25 configured to emit ultraviolet light (UV light) is disposed inside the glass tube 21, and the region filled with the substance that reduces cerium oxide is irradiated with light from the inside and the outside. Note that a configuration may be adopted in which either one of the light sources 24 and the light source 25 is disposed, and the region filled with the substance that reduces cerium oxide is irradiated with light from either the inside or the outside.

Then, a polishing liquid containing cerium oxide is caused to pass through the region formed between the glass tube 20 and the glass tube 21, that is, the region filled with the substance 22 that reduces cerium oxide in response to light irradiation, and at this time, as a result of performing light irradiation using the above-described light sources, it is possible to reduce cerium oxide in the polishing liquid.

In the present invention, the substance that reduces cerium oxide is excited and activated. As a result of irradiating this substance that reduces cerium oxide with light having energy that is larger than or equal to the band gap, electron excitation occurs. Thus, the substance to be used needs to be irradiated with light having a wavelength that is shorter than (light having energy that is larger than) that of light having energy corresponding to the band gap of the substance to be used. As shown in Table 1 above, although the value of a band gap changes depending on the substance, normally, it is desired that light having a wavelength of less than 350 nm is used. An ultraviolet lamp such as a xenon lamp, a (super) high pressure mercury-vapor lamp, a carbon-arc lamp, or a metal halide lamp can be used as a light source that emits light having such a wavelength.

The substance that reduces cerium oxide in response to light irradiation is similar to that of the first embodiment, and examples thereof include substances having photocatalytic activity capable of reducing cerium oxide abrasive particles in response to light irradiation. Thus, in the present embodiment, the "substance that reduces cerium oxide in response to light irradiation" will also be referred to as "a photocatalytic substance of the present invention" or simply referred to as "photocatalytic substance" hereinafter.

Similarly to the first embodiment, examples of such a photocatalytic substance of the present invention include gallium oxide, tantalum oxide, tantalates, niobium oxide, niobates, and titanium oxide. Specific examples of these substances include $Ga_2O_3$, $Ta_2O_5$, $LiTaO_3$, $NaTaO_3$, $KTaO_3$, $Nb_2O_5$, $LiNbO_3$, $NaNbO_3$, $KNbO_3$, $(K_{0.5}Na_{0.5})NbO_3$, and $TiO_2$. If titanium oxide is used, any one of three crystal forms of an anatase type, rutile type, and brookite type may be used. In particular, the anatase type and brookite type are preferable because these types of titanium oxide have high photocatalytic activity.

It is inferred that the reason as to why the above-described issues of the present invention can be resolved is due to processing for polishing a glass substrate being performed using a polishing liquid containing cerium oxide that has been reduced using a method for reducing cerium oxide using such a photocatalytic substance of the present invention, that is, the reason as to why the polishing speed can be increased compared to a conventional polishing speed and a polishing speed increase effect can be maintained for a long period of time is similar to that of the above-described first embodiment. That is, as described above, in order to increase the polishing speed, it is necessary to facilitate the reducing action of cerium oxide on glass. In order to facilitate the reducing action, the ratio of trivalent cerium or cerium ions contributing to the reducing action on glass needs to be increased, and thus it is desired that cerium oxide is efficiently reduced using the above-described photocatalytic substance. As is clear from the above-described embodiment shown in FIG. 4, with the method for reducing cerium oxide of the present invention, the photocatalytic substance is substantially fixed in the region filled with the photocatalytic substance and does not move freely, and thus it is possible to efficiently excite and activate the photocatalytic substance through light irradiation, and as a result of causing the polishing liquid containing cerium oxide to pass through the region filled with the photocatalytic substance, cerium oxide and the photocatalytic substance come into contact with each other with high efficiency, and as a result cerium oxide can be efficiently reduced.

Also, when the method for reducing cerium oxide according to the present invention is used, the polishing liquid does not contain a photocatalytic substance, and thus it is possible to keep foreign matter originating from a photocatalytic substance from attaching to a substrate surface that has undergone polishing processing and cleaning processing.

Note that, although electrons of cerium oxide included as polishing abrasive particles are also excited in response to light irradiation, as described above, in the present invention, irradiation light is efficiently absorbed by the photocatalytic substance due to the polishing liquid containing cerium oxide passing through the region filled with the photocatalytic substance, and thus it is possible to reduce the risk that irradiation light will be absorbed by cerium oxide and not reach the photocatalytic substance. If cerium oxide absorbs irradiation light, it is thought that the excited electrons will have little reducing action on glass. It is inferred that, if electrons of cerium oxide are excited to the conduction band, holes are formed in the valence band, and thus the state of excited electrons is unstable, and the excited state has a short lifespan. It is thought that, as in the present invention, if electrons are donated to cerium oxide from another substance (that is, the photocatalytic substance of the present invention), cerium oxide can obtain electrons in a state in which the valence band of cerium oxide has no holes, and thus the excited state has a long lifespan (that is, the reducing action is strong).

A band gap of the photocatalytic substance of the present invention is also desirably larger than a band gap of cerium oxide in the present embodiment because of a reason similar to that of the first embodiment. Also, it is desirable that the energy level at the lower end of the conduction band of the photocatalytic substance of the present invention is higher than the energy level at the lower end of the conduction band of cerium oxide.

Note that the above-described band gap, energy level at the lower end of the conduction band, and a method for measuring these values are the same as those described in the above-described embodiment. The band gaps and the energy levels at the lower ends of the conduction bands of the photocatalytic substances described as examples are shown in Table 1 described above.

With the method for reducing cerium oxide of the present invention, as in the above-described embodiment shown in FIG. 4, it is preferable to use the photocatalytic substance having a particle diameter of 1.5 mm or more for filling the region formed between the glass tube 20 and the glass tube 21. This is because, if this region is filled with the photocatalytic substance with a small particle diameter (less than 1.5 mm) to the extent that the photocatalytic substance does not move freely in this region, almost all gaps between particles are eliminated, and thus it is difficult for the polishing liquid to pass through this region.

Also, in the present invention, a configuration may be adopted in which the region formed between the glass tube 20 and the glass tube 21 is filled with carrier particles with the photocatalytic substance attached to the surfaces thereof (the surfaces have the photocatalytic substance). That is, from the viewpoint of being advantageous in terms of the manufacturing cost, carrier particles with the photocatalytic substance attached to the surfaces may be used, instead of particles completely made of the photocatalytic substance. Examples of the carrier particles in this case include zirconia, alumina, glass, silicone carbide, nylon, and polyurethane particles. It is preferable to use a carrier particle having a particle diameter of 1.5 mm or more for the same reasons as above. Also, at this time, the particle diameter of the photocatalytic substance attached to the surface of the carrier particle is preferably 1/1000 or less of the particle diameter of the carrier particle. If carrier particles are relatively large and the particle diameter of a substance for attachment is larger than 1/1000 of the particle diameter of the carrier particles, there is a risk that an attachment force of the substance to the surfaces of the carrier particles will decrease and the photocatalytic substance will soon separate from the surface of the carrier particles in long-term use, and carrier particles will be mixed in the polishing liquid.

Carrier particles with the photocatalytic substance attached to the surfaces can be manufactured as follows.

That is, a mixer provided with a mixing tank and members such as high-speed rotating blades is used, carrier particles such as zirconia beads and the photocatalytic substance are introduced into and mixed in the mixing tank, and a shearing stress is applied, and thus carrier particles and the photocatalytic substance strongly rub each other in the mixing tank. Blending amounts of carrier particles and the photocatalytic substance in this case may be determined as appropriate in consideration of a coverage of the photocatalytic substance on the surfaces of carrier particles and the like. In this manner, it is possible to obtain carrier particles with the photocatalytic substance attached to the surfaces. Of course, the manufacturing method is not necessarily limited to such a manufacturing method.

The coverage of the photocatalytic substance on the surfaces of the carrier particles is desirably 30% or more, and more desirably 50% or more. If the coverage of the photocatalytic substance is less than 30%, sufficient functional effects of the present invention are not obtained in some cases. Note that the coverage of the photocatalytic substance can be evaluated through a structural analysis using XRD (X-ray Diffraction) and a content analysis, surface observation using a SEM (Scanning Electron Microscope), or appropriately using an analysis method such as elemental analysis using EDX (Energy Dispersive X-ray Spectroscopy) and element mapping. For example, it is possible to evaluate a ratio using a binarizing method through image processing using an element mapping image obtained by subjecting an image obtained by observing a surface using a SEM to elemental analysis using EDX.

Note that, of course, an embodiment of the method for reducing cerium oxide of the present invention is not limited to the above-described embodiment shown in FIG. 4.

The polishing liquid that contains, as polishing abrasive particles, cerium oxide reduced using such a method for reducing cerium oxide and is used in polishing processing is a combination of polishing abrasive particles and water that is a solvent. When preparing a polishing liquid containing cerium oxide abrasive particles, it is sufficient that pure water is used, for example, and cerium oxide abrasive particles and other additives are added as needed to prepare a polishing liquid.

From the viewpoint of polishing efficiency, it is preferable to use cerium oxide abrasive particles that are included in the polishing liquid and have an average particle diameter of about 0.1 to 2.0 μm. In particular, it is preferable to use cerium oxide abrasive particles having an average particle diameter of about 0.8 to 1.3 μm.

Also, although highly pure cerium oxide that contains no impurities can essentially be used as the above-described cerium oxide abrasive particles, cerium oxide abrasive particles preferably contain lanthanum (La) in the present invention. Using cerium oxide abrasive particles containing lanthanum (La) makes it possible to further increase the polishing speed. The content of lanthanum is expressed as the content of lanthanum oxide ($La_2O_3$) with respect to TREO (total rare-earth oxides: the amount of oxides of all of the rare earth elements in the polishing agent).

With regard to the content of lanthanum when cerium oxide abrasive particles contain lanthanum (La) in this manner, the content of lanthanum oxide ($La_2O_3$) with respect to TREO is preferably in a range of 1 to 50%, for example. Also, the content of lanthanum oxide with respect to TREO is more preferably in a range of 20 to 40%. If the content of lanthanum oxide ($La_2O_3$) is less than 1%, the effect of cerium oxide abrasive particles containing lanthanum (La) is not significantly obtained. Also, if the content of lanthanum oxide ($La_2O_3$) is greater than 50%, the cerium oxide component is relatively low, and the polishing speed may decrease.

Although there is no particular limitation on the content of the cerium oxide abrasive particles in the polishing liquid and the content can be adjusted as appropriate, from the viewpoint of the polishing speed and cost, the content can be preferably set to 1 to 20 wt %, for example. Note that the substance that reduces cerium oxide in the polishing liquid needs to be sufficiently activated through light irradiation in the present embodiment, and thus from the viewpoint of ensuring the length of light such as ultraviolet rays entering the polishing liquid (slurry), the polishing liquid particularly preferably contains cerium oxide abrasive particles in an amount of 1 to 10 wt %, for example.

Note that, if the cerium oxide abrasive particles contain lanthanum as described above, the content of cerium oxide abrasive particles in the polishing liquid is in a range that is similar to that above.

Also, because cerium oxide is included as the main component of polishing abrasive particles in the present embodiment, more than 50 wt % of the polishing abrasive particles included in the polishing liquid is preferably cerium oxide, 70 wt % or more of the polishing abrasive particles is more preferably cerium oxide, and 90 wt % or more of the polishing abrasive particles is most preferably cerium oxide.

Also, in the present embodiment, it is preferable to use the polishing liquid containing cerium oxide abrasive particles in an alkaline condition. Use of the polishing liquid in an alkaline condition makes it possible to prevent aggregation and precipitation of cerium oxide microparticles, which are the polishing abrasive particles, increase the polishing speed, and reduce polishing blemishes. From the viewpoint of prevention of aggregation and precipitation of polishing abrasive particles, the pH of the polishing liquid is preferably in a range of 8 to 12. The pH of the polishing liquid is more preferably in a range of 9 to 11.

The polishing method, polishing conditions, and the like in the polishing processing are similar to those of the above-described first embodiment. Of course, it is preferable to use the polishing liquid containing cerium oxide abrasive particles reduced using the method for reducing cerium oxide of the present invention.

In the present invention, it is possible to directly supply the polishing liquid containing reduced cerium oxide abrasive particles to the polishing apparatus and perform polishing processing according to the above-described embodiment as shown in FIG. 4, for example. Also, the pH and the concentration of abrasive particles may be adjusted, an additive may be added as appropriate before the polishing liquid containing reduced cerium oxide abrasive particles is supplied to the polishing apparatus according to above-described embodiment as shown in FIG. 4, for example. Although, when multiple substrates are subjected to continuous polishing processing, the polishing liquid is not replaced midway in the processing, and the polishing liquid is used while the polishing liquid is collected and the collected polishing liquid is circulated, according to the present invention, even if such continuous polishing processing is performed, the polishing speed can be increased from the beginning, and this effect can be maintained for a long period of time, and thus the present invention is suitable for a case where the polishing liquid is used while the polishing liquid is circulated as in continuous polishing processing.

In general, processing for polishing main surfaces of substrates is usually performed over two stages, namely, first polishing processing for removing blemishes and warping remaining from grinding processing so as to achieve predetermined smooth surfaces and second polishing processing for finishing the surface roughness of the main surfaces of the glass substrates into smooth mirror surfaces (however, there are cases where multi-stage polishing with three or more stages is performed), and in this case, it is preferable to apply the present invention to at least the first polishing processing, which is the preceding stage. Also, finishing (precision) polishing processing (second polishing processing), which is performed in the latter stage, is preferably performed using a polishing liquid containing colloidal silica abrasive particles having an average particle diameter of about 10 to 100 nm, for example, and the details are the same as those described in the first embodiment.

The polishing method using the polishing liquid containing cerium oxide reduced using the method for reducing cerium oxide according to the present invention can be preferably applied to not only the processing for polishing main surfaces of a glass substrate but also processing for polishing edge surfaces of the glass substrate. The processing for polishing edge surfaces of the glass substrate is the same as that described in the first embodiment, and thus will not be described herein.

Applying the present embodiment to the processing for polishing edge surfaces of a glass substrate makes it possible to increase the polishing speed and maintain such a polishing speed increase effect for a long period of time, and this polishing speed increase effect is long-lasting.

The glass substrate to be polished in the present embodiment is the same as that described in the first embodiment. The present embodiment is particularly suitable for processing for polishing a heat resistant glass substrate having a high glass transition temperature (Tg). The heat resistant glass substrate having such a composition is preferable because such a heat resistance glass substrate contains relatively smaller amounts of oxides of alkali metals (Li, Na, K, and the like), compared to a conventionally used glass substrate, and has a better effect of suppressing a decrease in the polishing speed due to polishing processing to which a polishing liquid containing the cerium oxide reduced using the method for reducing cerium oxide according to the present embodiment is applied being performed.

As described above, according to the present embodiment, it is possible to provide a method for reducing cerium oxide by which cerium oxide included, as polishing abrasive particles, in a polishing liquid used when processing for polishing a glass substrate is performed can be efficiently reduced. Also, as a result of performing processing for polishing a glass substrate using a polishing liquid containing cerium oxide reduced using such a method for reducing cerium oxide, a polishing speed that is higher than a conventional polishing speed can be achieved, and such a high polishing speed can be maintained for a long period of time. Also, when the method for reducing cerium oxide according to the present invention is used, the polishing liquid does not contain a photocatalytic substance, and thus it is possible to keep foreign matter originating from a photocatalytic substance from attaching to the substrate surface that has undergone polishing processing and cleaning processing. Also, as described above, it is possible to maintain such a high polishing speed for a long period of time, and thus the present invention is suitable for a case where continuous polishing processing is performed without replacing the polishing liquid during processing, for example. In particular, the polishing method of the present embodiment is suitable for processing for polishing a magnetic-disk glass substrate.

Note that, although a detailed description of points similar to those of the above-described first or second embodiment is omitted in the third embodiment described above, the first or second embodiment may be applied similarly.

WORKING EXAMPLES

Although embodiments of the present invention will be described in detail by way of working examples below, the present invention is not limited to the following working examples.

The working examples below are working examples that correspond to the above-described first embodiment.

Working Example 1

A magnetic-disk glass substrate of this working example was manufactured through (1) rough grinding processing, (2) shape processing, (3) precision grinding processing, (4) edge surface polishing processing, (5) main surface first polishing processing, and (6) main surface second polishing processing as described below.

(1) Rough Grinding Processing

First, a disk-shaped glass substrate made of aluminosilicate glass and having a diameter of 66 mmø and a thickness of 1.0 mm was obtained from molten glass through direct pressing using an upper, a lower, and a drum mold. Note that, instead of using direct pressing, a glass substrate may be obtained by cutting plate glass manufactured using a downdraw method or a float method to a predetermined size. Glass that contains $SiO_2$ in an amount of 58 to 75 wt %, $Al_2O_3$ in an amount of 5 to 23 wt %, $Li_2O$ in an amount of 3 to 10 wt %, and $Na_2O$ in an amount of 4 to 13 wt % was used as this aluminosilicate glass. Note that the content of $Al_2O_3$ was 8.5 mol %. Hereinafter, this glass material is referred to as "Glass Material 1".

Next, in order to improve dimensional accuracy and shape accuracy, the rough grinding processing was performed on this glass substrate using alumina-based loose abrasive particles. This rough grinding processing was performed using a double-side grinding apparatus.

(2) Shape Processing

Next, a cylindrical grindstone was used to create a hole in the central portion of the glass substrate and an outer circumferential edge surface was ground to have a diameter of 65 mmø, whereafter predetermined chamfering was performed on the outer circumferential edge surface and an inner circumferential edge surface. In general, a magnetic disk having an outer diameter of 65 mm is used in a 2.5-inch HDD (hard disk drive).

(3) Precision Grinding Processing

This precision grinding processing was performed using a double-side grinding apparatus in which the glass substrate held by a carrier was tightly placed between the upper and lower surface plates to which pellets obtained by fixing diamond abrasive particles with a resin were attached, while a coolant was supplied. A roughness Ra of main surfaces of the substrate after the precision grinding processing was 100 nm or less. Note that the surface roughness after the precision grinding processing was measured using a stylus type roughness tester.

After undergoing the above-described precision grinding processing, the glass substrate was cleaned.

(4) Edge Surface Polishing Processing

Next, the edge surfaces (inner and outer circumferential edge surfaces) of the glass substrate were polished through brushing while the glass substrate was rotated. A roughness Ra of edge surfaces of the substrate after the edge surface polishing processing was 100 nm or less. Then, after undergoing edge surface polishing above, the glass substrate was cleaned.

(5) Main Surface First Polishing Processing

Next, the first polishing processing for removing blemishes and warping remaining from the above-described grinding processing so as to achieve predetermined smooth surfaces was performed using the above-described double-side polishing apparatus shown in FIG. 3 above. In the double-side polishing apparatus, the glass substrate held by the carrier 4 is tightly placed between the upper and lower surface plates 5 and 6 to which the polishing pads 7 have been attached, the carrier 4 is engaged with the sun gear 2 and the internal gear 3, and the glass substrate is pressed by the upper and lower surface plates 5 and 6. Thereafter, a polishing liquid is supplied between the polishing pads and the glass substrate surfaces to be polished, the gears and the upper and lower surface plates are rotated, and thus the glass substrate revolves while rotating on the surface plates 5 and 6 so that both surfaces of the glass substrate are polished simultaneously due to the planetary gear mechanism. Specifically, the first polishing processing was performed using a suede polisher (made of polyurethane foam) having an Asker C hardness of 80, as the polisher (polishing pad).

An alkaline polishing liquid that had a pH of 10, contained, as polishing abrasive particles, 10 wt % cerium oxide (having an average particle diameter of 1 μm) not containing lanthanum oxide, and contained, as the photocatalytic substance, $TiO_2$ (having an average particle diameter of 100 nm) in an amount of 1.0 wt % was used as the polishing liquid. $TiO_2$ in which the content of a rutile crystal structure is 20% or less and an anatase crystal structure is the main component was used. Also, the polishing liquid was irradiated with ultraviolet rays from an ultraviolet lamp (having a wavelength of 254 nm) at a distance of 3 cm immediately before the polishing liquid was introduced into a double-side polishing apparatus. Note that a supply pipe for supplying the polishing liquid is configured such that a portion, which is irradiated with ultraviolet rays from the ultraviolet lamp, of the supply pipe is made of a transparent material, and the polishing liquid inside the supply pipe is irradiated with ultraviolet rays emitted from the outside of the supply pipe. The irradiation time calculated from the flow rate of the polishing liquid is 3.5 seconds. In the case of usage of post-polishing polishing liquid being collected and then circulated, the polishing liquid is repeatedly irradiated with ultraviolet rays immediately before entering the polishing device. The time from when the polishing liquid is supplied from a portion irradiated therewith to the inside of the polishing device is approximately 5 seconds. Also, the polishing load was set to 120 g/cm² and the machining allowance was set to 30 μm in terms of the substrate thickness. A roughness Ra of the surfaces of the substrate after polishing was 1.5 nm or less.

In the above-described first polishing processing, the polishing liquid was not replaced, and 20 batches (100 substrates per batch) were continuously processed using the polishing liquid while the polishing liquid was collected and the collected polishing liquid was circulated. After undergoing the above-described first polishing processing, the glass substrates were cleaned.

(6) Main Surface Second Polishing Processing

Next, the second polishing processing was performed using the same double-side polishing apparatus as used in the above-described first polishing processing, but polishing pads (made of polyurethane foam) with a soft polisher (suede type) having an Asker C hardness of 70 as the polisher were used instead. This second polishing processing is mirror-polishing processing for finishing the surface roughness of the main surfaces of the glass substrates into smooth mirror surfaces, for example, such that the surface roughness Ra of the main surfaces of the glass substrates is 0.2 nm or less and a surface roughness Rmax thereof is 2 nm or less. A polishing liquid containing 10 wt % colloidal silica (having an average particle diameter of 15 nm) as polishing abrasive particles was used as the polishing liquid. Note that the pH of the polishing liquid was adjusted to be acidic (pH=2) by adding sulfuric acid to the polishing liquid in advance. Also, the polishing load was set to 100 g/cm² and the machining allowance was set to 3 μm in terms of the substrate thickness.

Next, after undergoing the above-described second polishing processing, the glass substrates were subjected to cleaning processing (final cleaning processing). Specifically, ultrasonic cleaning was performed by immersing the glass substrates into a cleaning tank in which an alkaline detergent was added to pure water. Thereafter, the glass substrates were sufficiently rinsed with pure water and then dried.

When the surface roughness (Ra) of the main surfaces of the glass substrates that were obtained through the above-described processes and after the above-described final cleaning processing was measured using an atomic force microscope (AFM), the glass substrates had smooth surfaces having an Ra of 0.2 nm or less and an Rmax of 2 nm or less.

Working Examples 2 to 4

Glass substrates of Working Examples 2 to 4 were produced similarly to Working Example 1 except that polishing liquids obtained by respectively substituting the photocatalytic substances included in the polishing liquid used in the main surface first polishing processing in Working Example 1 above with $Ga_2O_3$ (B—$Ga_2O_3$), $Ta_2O_5$, and $LiNbO_3$ were used.

Comparative Example 1

A glass substrate of Comparative Example 1 was produced similarly to Working Example 1 except that a polishing liquid to which a photocatalytic substance was not added was used as the polishing liquid used in the main surface first polishing processing in Working Example 1 above.

The polishing speeds in the above-described main surface first polishing processing of Working Examples 1 to 4 and Comparative Example 1 above were measured in the first batch and the twentieth batch, the relative ratios of the polishing speeds of the working examples with respect to the polishing speed of Comparative Example 1 (the polishing speed of a working example/the polishing speed of Comparative Example 1) were calculated, and the results are collectively shown in Table 2 below. Note that the relative ratios of the polishing speeds are ratios in the same batch number.

TABLE 2

| | Types of Photocatalytic Substance | Polishing Speed in First Batch (Relative Ratio) | Polishing Speed in Twentieth Batch (Relative Ratio) |
|---|---|---|---|
| Comp. Ex. 1 | N/A | 1.00 (Ref. 1) | 1.00 (Ref. 2) |
| Work. Ex. 1 | $TiO_2$ | 1.05 | 1.13 |
| Work. Ex. 2 | $Ga_2O_3$ | 1.11 | 1.28 |
| Work. Ex. 3 | $Ta_2O_5$ | 1.15 | 1.33 |
| Work. Ex. 4 | $LiNbO_3$ | 1.20 | 1.36 |

Based on the results of Table 2 above, the following was found.

1. According to the working examples of the present invention, as a result of adding the photocatalytic substance of the present invention to the polishing liquid containing cerium oxide abrasive particles, the polishing speed can be improved from the beginning with respect to the comparative example that does not contain the photocatalytic substance.

2. Also, according to the working examples of the present invention, such a trend continues not only in the first batch but also in the twentieth batch, and even in the case where many substrates are subjected to the polishing processing through continuous polishing processing, a polishing speed increase effect resulting from the addition of a photocatalytic substance is long-lasting, and a polishing speed that is higher than a conventional polishing speed can be maintained for a long period of time.

Note that, when a glass substrate of Comparative Example A was produced similarly to Working Example 1 apart from a polishing liquid to which cerium oxide (having an average particle diameter of 100 nm) not containing lanthanum oxide was added being used, instead of the photocatalytic substance added to the polishing liquid used in the main surface first polishing processing in Working Example 1, relative ratios of the polishing speeds in the first batch and the twentieth batch were both 1.00, and an improvement from Comparative Example 1 was not confirmed.

Working Examples 5 to 8

Glass substrates of Working Examples 5 to 8 were produced similarly to Working Examples 1 to 4 except that a polishing liquid was used which was obtained by substituting the polishing abrasive particles that were included in the polishing liquids that were used in the main surface first polishing processing in Working Examples 1 to 4 above, with cerium oxide abrasive particles containing 20% La as the ratio of $La_2O_3$ to TREO.

The polishing speeds in the above-described main surface first polishing processing of Working Examples 5 to 8 above were measured in the first batch and the twentieth batch, relative ratios of the polishing speeds in the working examples with respect to the polishing speed of Comparative Example 1 (the polishing speed of a working example/the polishing speed of Comparative Example 1) were calculated, and the results are collectively shown in Table 3 below.

TABLE 3

| | Types of Photocatalytic Substance | Polishing Speed in First Batch (Relative Ratio) | Polishing Speed in Twentieth Batch (Relative Ratio) |
|---|---|---|---|
| Work. Ex. 5 | $TiO_2$ | 1.11 | 1.23 |
| Work. Ex. 6 | $Ga_2O_3$ | 1.21 | 1.34 |
| Work. Ex. 7 | $Ta_2O_5$ | 1.28 | 1.45 |
| Work. Ex. 8 | $LiNbO_3$ | 1.29 | 1.41 |

Based on the results of Table 3 above, the following was found.
1. As a result of preparing the polishing liquid by adding the photocatalytic substance of the present invention to the cerium oxide abrasive particles to which La was added, the polishing speed can be improved with respect to a case where cerium oxide abrasive particles that do not contain La is used.
2. Also, according to the working examples of the present invention, such a trend continues not only in the first batch but also in the twentieth batch, and even in the case where many substrates are subjected to the polishing processing through continuous polishing processing, a polishing speed increase effect resulting from the addition of a photocatalytic substance is long-lasting, and a polishing speed that is higher than a conventional polishing speed can be maintained for a long period of time.

Also, from the results shown in Tables 2 and 3 above, $TiO_2$, $Ga_2O_3$, $Ta_2O_5$, and $LiNbO_3$ are preferable in the order of $TiO_2 < Ga_2O_3$, $< Ta_2O_5 < LiNbO_3$. In other words, among photocatalytic substances, titanium oxide, gallium oxide, tantalum oxide or tantalates, niobium oxide or niobates are preferable in the order of titanium oxide<gallium oxide<tantalum oxide or tantalates<niobium oxide or niobates.

Working Examples 9 to 12, Comparative Example 2

Similarly to Working Example 1 above, (1) rough grinding processing, (2) shape processing, and (3) precision grinding processing were performed sequentially, and then edge surface polishing processing below was performed. Note that Glass Material 1 above was used as the glass substrate.

The glass substrates resulting from the grinding processing above were stacked using a support jig to form a glass substrate stacked body. At that time, the glass substrate stacked body was formed by inserting resin spacers between glass substrates and placing 200 glass plates in total on one another.

The glass substrate stacked body formed in the above manner was inserted into a jig for outer circumferential edge surface polishing and the glass substrate stacked body was fixed by clamping the glass substrate stacked body vertically. The glass substrate stacked body was installed at a predetermined position of the outer circumferential edge surface polishing apparatus. The rotary brush for edge surface polishing was brought into contact with and pressed against the outer circumferential side edge surface of the glass substrate stacked body by a predetermined amount. The polishing liquid was supplied to an outer circumferential edge surface portion of the glass substrate stacked body, the rotary brush and the glass substrate stacked body were rotated in opposite directions, and the glass substrate stacked body was polished while the rotary brush was swung in the direction in which the glass substrates were stacked.

The same polishing liquid as that used in Working Examples 1 to 4 and Comparative Example 1 (that is, an alkaline polishing liquid that contained cerium oxide (having an average particle diameter of 1 μm) as the polishing abrasive particles (the content was 10 wt %), contained 1.0 wt % photocatalytic substances (having an average particle diameter of 100 nm) shown in Table 4, and had a pH of 10) was used as the polishing liquid.

Note that the polishing liquid was irradiated with ultraviolet rays from an ultraviolet lamp (having a wavelength of 254 nm) at a distance of 3.0 cm immediately before the polishing liquid was introduced to a glass substrate stacked body. The irradiation time calculated from the flow rate of the polishing liquid is 3.5 seconds. In the case of usage of post-polishing polishing liquid being collected and then circulated, the polishing liquid is repeatedly irradiated with ultraviolet rays immediately before entering the polishing device. The time from when the polishing liquid is supplied from a portion irradiated therewith to the inside of the polishing device is approximately 5 seconds.

Note that in these working examples and comparative example, the polishing liquid supply amount was set to 10 to 15 L/min, the rotation speed of the rotary brush was set to 300 rpm, the swing speed of the rotary brush in the support axial direction was set to 3 to 5 rpm (3 to 5 reciprocations per minute), and the rotation speed of the glass substrate stacked body was set to 80 to 90 rpm. The machining allowance was set to 40 μm in terms of the substrate thickness.

Also, the polishing liquid was not replaced in the working examples and the comparative example, and 20 batches were continuously processed while the polishing liquid was collected and the collected polishing liquid was circulated.

The polishing speeds in the above-described edge surface polishing processing of Working Examples 9 to 12 and Comparative Example 2 above were measured in the first batch and the twentieth batch, the relative ratios of the polishing speeds of the working examples with respect to the polishing speed of Comparative Example 2 in which the polishing liquid not containing a photocatalytic substance was used (the polishing speed of a working example/the polishing speed of Comparative Example 2) were calculated, and the results are collectively shown in Table 4 below.

TABLE 4

|  | Types of Photocatalytic Substance | Polishing Speed in First Batch (Relative Ratio) | Polishing Speed in Twentieth Batch (Relative Ratio) |
| --- | --- | --- | --- |
| Comp. Ex. 2 | N/A | 1.00 (Ref. 3) | 1.00 (Ref. 4) |
| Work. Ex. 9 | $TiO_2$ | 1.05 | 1.09 |
| Work. Ex. 10 | $Ga_2O_3$ | 1.17 | 1.25 |
| Work. Ex. 11 | $Ta_2O_5$ | 1.10 | 1.24 |
| Work. Ex. 12 | $LiNbO_3$ | 1.26 | 1.49 |

Based on the results of Table 4 above, the following was found.
1. In the glass substrate edge surface polishing processing, as a result of adding the photocatalytic substance of the present invention to the polishing liquid, the polishing speed can also be improved with respect to the comparative example that does not contain the photocatalytic substance.

Also, according to the working examples of the present invention, such a trend continues not only in the first batch but also in the twentieth batch, and it is possible to maintain the polishing speed during continuous polishing processing at a high rate. Because the polishing speed is more likely to decrease in edge surface polishing processing than in the main surface polishing processing, the present invention is significantly effective.

Note that, when a glass substrate was produced similarly to Working Example 9 except that a polishing liquid to which cerium oxide (having an average particle diameter of 100 nm) not containing lanthanum oxide was added was used, instead of the photocatalytic substance added to the polishing liquid used in the edge surface polishing processing in Working Example 9, relative ratios of the polishing speeds in the first batch and the twentieth batch were both 1.00, and an improvement from Comparative Example 2 was not confirmed in the edge surface polishing processing.
(Manufacturing of Magnetic Disk)

A magnetic disk for perpendicular magnetic recording was obtained by performing the following film formation steps on the magnetic-disk glass substrate that was obtained in Working Example 1 above.

That is, an adherent layer constituted by a CrTi-based alloy thin film, a soft magnetic layer constituted by a CoTaZr alloy thin film, a seed layer constituted by NiW, a base layer constituted by a Ru thin film, a perpendicular magnetic recording layer made of a CoCrPt-based alloy, a carbon protective layer, and a lubricant layer were sequentially formed on the above-described glass substrate. The protective layer is for preventing degradation of the magnetic recording layer caused by contact with the magnetic head, and the protective layer is composed of hydrogenated carbon and yields wear resistance. Also, the lubricant layer was formed using a dipping method using an alcohol-modified perfluoropolyether liquid lubricant.

When the obtained magnetic disk was incorporated into an HDD equipped with a DFH (Dynamic Flying Height) head, and a load and unload durability test was performed for one month while the DFH function was operated under a high temperature and high humidity environment having a temperature of 80° C. and a RH of 80%, there was no failure and a good result was obtained. Note that similar results were obtained also in the case where the magnetic-disk glass substrates that were obtained in the other working examples were used.

The working examples below are working examples that correspond to the above-described second embodiment.

Working Example 13

A magnetic-disk glass substrate of this working example was manufactured through (1) rough grinding processing, (2) shape processing, (3) precision grinding processing, (4) edge surface polishing processing, (5) main surface first polishing processing, and (6) main surface second polishing processing as described below.
(1) Rough Grinding Processing First, a disk-shaped glass substrate made of aluminosilicate glass and having a diameter of 66 mmø and a thickness of 1.0 mm was obtained from molten glass through direct pressing using an upper, a lower, and a drum mold. Note that, instead of using direct pressing, a glass substrate may be obtained by cutting plate glass manufactured using a downdraw method or a float method to a predetermined size. Glass that can be chemically strengthened and contains $SiO_2$ in an amount of 58 to 75 wt %, $Al_2O_3$ in an amount of 5 to 23 wt %, $Li_2O$ in an amount of 3 to 10 wt %, and $Na_2O$ in an amount of 4 to 13 wt % was used as this aluminosilicate glass. Note that the content of $Al_2O_3$ was 8.5 mol %. Hereinafter, this glass material is referred to as "Glass Material 1".

Next, in order to improve dimensional accuracy and shape accuracy, the rough grinding processing was performed on this glass substrate using alumina-based loose abrasive particles. This rough grinding processing was performed using a double-side grinding apparatus.
(2) Shape Processing Next, a cylindrical grindstone was used to create a hole in the central portion of the glass substrate and an outer circumferential edge surface was ground to have a diameter of 65 mmø, whereafter predetermined chamfering was performed on the outer circumferential edge surface and an inner circumferential edge surface. In general, a magnetic disk having an outer diameter of 65 mm is used in a 2.5-inch HDD (hard disk drive).
(3) Precision Grinding Processing This precision grinding processing was performed using a double-side grinding apparatus in which the glass substrate held by a carrier was tightly placed between the upper and lower surface plates to which pellets obtained by fixing diamond abrasive particles with a resin were attached, while a coolant was supplied. A roughness Ra of main surfaces of the substrate after the precision grinding processing was 100 nm or less. Note that the surface roughness after the precision grinding processing was measured using a stylus type roughness tester.

After undergoing the above-described precision grinding processing, the glass substrate was cleaned.
(4) Edge Surface Polishing Processing Next, the edge surfaces (inner and outer circumferential edge surfaces) of the glass substrate were polished through brushing while the glass substrate was rotated. A roughness Ra of main surfaces of the substrate after the edge surface polishing processing was 100 nm or less. Then, after undergoing edge surface polishing above, the glass substrate was cleaned.

(5) Main Surface First Polishing Processing

Next, the first polishing processing for removing blemishes and warping remaining from the above-described grinding processing so as to achieve predetermined smooth surfaces was performed using the above-described double-side polishing apparatus shown in FIG. 3. In the double-side polishing apparatus, the glass substrate held by the carrier 4 is tightly placed between the upper and lower surface plates 5 and 6 to which the polishing pads 7 have been attached, the carrier 4 is engaged with the sun gear 2 and the internal gear 3, and the glass substrate is pressed by the upper and lower surface plates 5 and 6. Thereafter, a polishing liquid is supplied between the polishing pads and the glass substrate surfaces to be polished, the gears and the upper and lower surface plates are rotated, and thus the glass substrate revolves while rotating on the surface plates 5 and 6 so that both surfaces of the glass substrate are polished simultaneously due to the planetary gear mechanism. Specifically, the first polishing processing was performed using a suede polisher (made of polyurethane foam) having an Asker C hardness of 80, as the polisher (polishing pad).

An alkaline polishing liquid that had a pH of 10 and contained cerium oxide (having an average particle diameter of 1 μm) in an amount of 10 wt % as polishing abrasive particles, the surface of cerium oxide having a photocatalytic substance ($TiO_2$), was used as the polishing liquid. $TiO_2$ that had an average particle diameter of 30 nm and in which the content of a rutile crystal structure was 20% or less and an anatase crystal structure was the main component was used. These polishing abrasive particles were manufactured, using a mixer, by mixing cerium oxide abrasive particles and $TiO_2$ as the photocatalytic substance according to the above-described manufacturing method. Note that, when the coverage of the photocatalytic substance on the surfaces of the obtained abrasive particles was evaluated using the above-described method, the coverage was 10%.

Also, the polishing liquid was irradiated with ultraviolet rays from an ultraviolet lamp (having a wavelength of 254 nm) at a distance of 3 cm immediately before the polishing liquid was introduced into a double-side polishing apparatus. Note that a supply pipe for supplying the polishing liquid is configured such that a portion, which is irradiated with ultraviolet rays from the ultraviolet lamp, of the supply pipe is made of a transparent material, and the polishing liquid inside the supply pipe is irradiated with ultraviolet rays emitted from the outside of the supply pipe. The irradiation time calculated from the flow rate of the polishing liquid is 3.5 seconds. In the case of usage of post-polishing polishing liquid being collected and then circulated, the polishing liquid is repeatedly irradiated with ultraviolet rays immediately before entering the polishing device. The time from when the polishing liquid is supplied from a portion irradiated therewith to the inside of the polishing device is approximately 5 seconds. Also, the polishing load was set to 120 g/cm$^2$ and the machining allowance was set to 30 μm in terms of the substrate thickness. A roughness Ra of the surfaces of the substrate after polishing was 1.5 nm or less.

In the above-described first polishing processing, the polishing liquid was not replaced, and 20 batches (100 substrates per batch) were continuously processed using the polishing liquid while the polishing liquid was collected and the collected polishing liquid was circulated. After undergoing the above-described first polishing processing, the glass substrates were cleaned.

(6) Main Surface Second Polishing Processing

Next, the second polishing processing was performed using the same double-side polishing apparatus as used in the above-described first polishing processing, but polishing pads (made of polyurethane foam) with a soft polisher (suede type) having an Asker C hardness of 70 as the polisher were used instead. This second polishing processing is mirror-polishing processing for finishing the surface roughness of the main surfaces of the glass substrates into smooth mirror surfaces, for example, such that the surface roughness Ra of the main surfaces of the glass substrates is 0.2 nm or less and a surface roughness Rmax thereof is 2 nm or less. A polishing liquid containing 10 wt % colloidal silica (having an average particle diameter of 15 nm) as polishing abrasive particles was used as the polishing liquid. Note that the pH of the polishing liquid was adjusted to be acidic (pH=2) by adding sulfuric acid to the polishing liquid in advance. Also, the polishing load was set to 100 g/cm$^2$ and the machining allowance was set to 3 μm in terms of the substrate thickness.

Next, after undergoing the above-described second polishing processing, the glass substrates were subjected to cleaning processing (final cleaning processing). Specifically, ultrasonic cleaning was performed by immersing the glass substrates into a cleaning tank in which an alkaline detergent was added to pure water. Thereafter, the glass substrates were sufficiently rinsed with pure water and then dried.

When the surface roughness (Ra) of the main surfaces of the glass substrates that were obtained through the above-described processes and after the above-described final cleaning processing was measured using an atomic force microscope (AFM), the glass substrates had smooth surfaces having an Ra of 0.2 nm or less and an Rmax of 2 nm or less.

Working Example 14 to 16

Glass substrates of Working Examples 14 to 16 were produced similarly to Working Example 13 except that polishing abrasive particles obtained by respectively substituting the photocatalytic substances on the surfaces of the cerium oxide abrasive particles added in the polishing liquid used in the main surface first polishing processing in Working Example 13 above with $Ga_2O_3$, $Ta_2O_5$, and $LiNbO_3$ were used.

Comparative Example 3

A glass substrate of Comparative Example 3 was produced similarly to Working Example 13 except that a polishing liquid that contained cerium oxide abrasive particles alone (having an average particle diameter of 1 μm) in an amount of 10 wt % whose surfaces did not have a photocatalytic substance was used as the polishing liquid used in the main surface first polishing processing in Working Example 13 above.

Reference Example 1

A glass substrate of Reference Example 1 was produced similarly to Working Example 13 except that a polishing liquid to which 10 wt % cerium oxide abrasive particles (having an average particle diameter of 1 μm) and 1 wt % $TiO_2$ (having an average particle diameter of 100 nm) as a photocatalytic substance were added separately was used as the polishing liquid used in the main surface first polishing processing in Working Example 13 above.

The polishing speeds in the above-described main surface first polishing processing of Working Examples 13 to 16, Comparative Example 3, and Reference Example 1 above were measured in the first batch and the twentieth batch, the relative ratios of the polishing speeds of the working examples and Reference Example 1 with respect to the polishing speed of Comparative Example 3 (the polishing speed of a working example (or reference example)/the polishing speed of Comparative Example 3) were calculated, and the results are collectively shown in Table 5 below.

TABLE 5

| | Addition Method and Types of Photocatalytic Substance | Polishing Speed in First Batch (Relative Ratio) | Polishing Speed in Twentieth Batch (Relative Ratio) |
|---|---|---|---|
| Comp. Ex. 3 | No addition | 1.00 (Ref.) | 1.00 (Ref.) |
| Work. Ex. 13 | $TiO_2$ on surfaces of abrasive particles | 1.10 | 1.17 |
| Work. Ex. 14 | $Ga_2O_3$ on surfaces of abrasive particles | 1.18 | 1.34 |
| Work. Ex. 15 | $Ta_2O_5$ on surfaces of abrasive particles | 1.19 | 1.37 |
| Work. Ex. 16 | $LiNbO_3$ on surfaces of abrasive particles | 1.24 | 1.41 |
| Ref. Ex. 1 | Abrasive particles and $TiO_2$ added separately | 1.05 | 1.13 |

Based on the results of Table 5 above, the following was found.

1. According to the working examples of the present invention, as a result of adding the cerium oxide abrasive particles whose surfaces have a photocatalytic substance to the polishing liquid, the polishing speed can be improved from the beginning with respect to the comparative example that does not contain the photocatalytic substance.

2. Also, according to the working examples of the present invention, such a trend continues not only in the first batch but also in the twentieth batch, and even in the case where many substrates are subjected to the polishing processing through continuous polishing processing, a polishing speed increase effect resulting from using a photocatalytic substance is long-lasting, and a polishing speed that is higher than a conventional polishing speed can be maintained for a long period of time.

3. Note that, from a comparison between the working examples of the present invention and the reference example, a polishing speed increase effect is further improved when cerium oxide abrasive particles whose surfaces have a photocatalytic substance as in the present invention are used than the polishing liquid containing cerium oxide abrasive particles and the photocatalytic substance separately.

Note that, as a result of changing blending ratios of a photocatalytic substance mixed in a mixer based on the conditions of Working Example 16, cerium oxide abrasive particles whose surfaces had the photocatalytic substance at a coverage of 0.01%, 0.1%, 30%, and 50% were manufactured, and polishing experiments that were similar to that above were performed (Working Examples A to D). As a result, the polishing speed ratios in the twentieth batch were respectively 1.19, 1.32, 1.40, and 1.25, and even if the coverage was changed, a polishing speed increase effect was confirmed.

Working Examples 17 to 20, Comparative Example 4, Reference Example 2

Similarly to Working Example 13 above, (1) rough grinding processing, (2) shape processing, and (3) precision grinding processing were performed sequentially, and then edge surface polishing processing below was performed. Note that Glass Material 1 above was used as the glass substrate.

The glass substrates resulting from the grinding processing above were stacked using a support jig to form a glass substrate stacked body. At that time, the glass substrate stacked body was formed by inserting resin spacers between glass substrates and placing 200 glass plates in total on one another.

The glass substrate stacked body formed in the above manner was inserted into a jig for outer circumferential edge surface polishing and the glass substrate stacked body was fixed by clamping the glass substrate stacked body vertically. The glass substrate stacked body was installed at a predetermined position of the outer circumferential edge surface polishing apparatus. The rotary brush for edge surface polishing was brought into contact with and pressed against the outer circumferential side edge surface of the glass substrate stacked body by a predetermined amount.

The polishing liquid was supplied to an outer circumferential edge surface portion of the glass substrate stacked body, the rotary brush and the glass substrate stacked body were rotated in opposite directions, and the glass substrate stacked body was polished while the rotary brush was swung in the direction in which the glass substrates were stacked.

The polishing liquid that was the same as that used in Working Examples 13 to 16, Comparative Example 3, and Reference Example 1 above was used as the polishing liquid.

Also, with Working Examples 17 to 20 and Reference Example 2, the polishing liquid was irradiated with ultraviolet rays from an ultraviolet lamp (having a wavelength of 254 nm) at a distance of 3 cm for 3.5 seconds immediately before the polishing liquid was introduced to a glass substrate stacked body.

Note that in these working examples, comparative example, and reference example, the polishing liquid supply amount was set to 10 to 15 L/min, the rotation speed of the rotary brush was set to 300 rpm, the swing speed of the rotary brush in the support axial direction was set to 3 to 5 rpm (3 to 5 reciprocations per minute), and the rotation speed of the glass substrate stacked body was set to 80 to 90 rpm. The machining allowance was set to 40 μm in terms of the substrate thickness.

Also, the polishing liquid was not replaced in the working examples, the comparative example, and the reference example, and 20 batches were continuously processed while the polishing liquid was collected and the collected polishing liquid was circulated.

The polishing speeds in the above-described edge surface polishing processing of Working Examples 17 to 20, Comparative Example 4, and Reference Example 2 above were measured in the first batch and the twentieth batch, the relative ratios of the polishing speeds of the working examples and the reference example with respect to the polishing speed of Comparative Example 4 in which the polishing liquid not containing the photocatalytic substance was used (the polishing speed of a working example (or reference example)/the polishing speed of Comparative Example 4) were calculated, and the results are collectively shown in Table 6 below.

TABLE 6

| | Addition Method and Types of Photocatalytic Substance | Polishing Speed in First Batch (Relative Ratio) | Polishing Speed in Twentieth Batch (Relative Ratio) |
|---|---|---|---|
| Comp. Ex. 4 | No addition | 1.00 (Ref.) | 1.00 (Ref.) |
| Work. Ex. 17 | $TiO_2$ on surfaces of abrasive particles | 1.17 | 1.27 |
| Work. Ex. 18 | $Ga_2O_3$ on surfaces of abrasive particles | 1.28 | 1.40 |
| Work. Ex. 19 | $Ta_2O_5$ on surfaces of abrasive particles | 1.30 | 1.42 |
| Work. Ex. 20 | $LiNbO_3$ on surfaces of abrasive particles | 1.33 | 1.44 |
| Ref. Ex. 2 | Abrasive particles and $TiO_2$ added separately | 1.05 | 1.09 |

Based on the results of Table 6 above, the following was found.

1. In the glass substrate edge surface polishing processing, as a result of adding the cerium oxide abrasive particles whose surfaces have the photocatalytic substance of the present invention to the polishing liquid, the polishing speed can also be improved with respect to the comparative example that does not contain the photocatalytic substance.

Also, according to the working examples of the present invention, such a trend continues not only in the first batch but also in the twentieth batch, and it is possible to maintain the polishing speed during continuous polishing processing at a high rate. Because the polishing speed is more likely to decrease in edge surface polishing processing than in the main surface polishing processing, the present invention is significantly effective.

Note that, from a comparison between the working examples of the present invention and the reference example, a polishing speed increase effect is further improved when cerium oxide abrasive particles whose surfaces have a photocatalytic substance as in the present invention are used than the polishing liquid containing cerium oxide abrasive particles and the photocatalytic substance separately.

(Manufacturing of Magnetic Disk)

A magnetic disk for perpendicular magnetic recording was obtained by performing the following film formation steps on the magnetic-disk glass substrate that was obtained in Working Example 13 above.

That is, an adherent layer constituted by a CrTi-based alloy thin film, a soft magnetic layer constituted by a CoTaZr alloy thin film, a seed layer constituted by NiW, a base layer constituted by a Ru thin film, a perpendicular magnetic recording layer made of a CoCrPt-based alloy, a carbon protective layer, and a lubricant layer were sequentially formed on the above-described glass substrate. The protective layer is for preventing degradation of the magnetic recording layer caused by contact with the magnetic head, and the protective layer is composed of hydrogenated carbon and yields wear resistance. Also, the lubricant layer was formed using a dipping method using an alcohol-modified perfluoropolyether liquid lubricant.

When the obtained magnetic disk was incorporated into an HDD equipped with a DFH head, and a load and unload durability test was performed for one month while the DFH function was operated under a high temperature and high humidity environment having a temperature of 80° C. and a RH of 80%, there was no failure and a good result was obtained. Note that similar results were obtained also in the case where the magnetic-disk glass substrates that were obtained in the other working examples were used.

The working examples below are working examples that correspond to the above-described third embodiment.

Working Example 21

A magnetic-disk glass substrate of this working example was manufactured through (1) rough grinding processing, (2) shape processing, (3) precision grinding processing, (4) edge surface polishing processing, (5) main surface first polishing processing, and (6) main surface second polishing processing as described below.

(1) Rough Grinding Processing

First, a disk-shaped glass substrate made of aluminosilicate glass and having a diameter of 66 mmø and a thickness of 1.0 mm was obtained from molten glass through direct pressing using an upper, a lower, and a drum mold. Note that, instead of using direct pressing, a glass substrate may be obtained by cutting plate glass manufactured using a downdraw method or a float method to a predetermined size. Glass that can be chemically strengthened and contains $SiO_2$ in an amount of 58 to 75 wt %, $Al_2O_3$ in an amount of 5 to 23 wt %, $Li_2O$ in an amount of 3 to 10 wt %, and $Na_2O$ in an amount of 4 to 13 wt % was used as this aluminosilicate glass. Note that the content of $Al_2O_3$ was 8.5 mol %. Hereinafter, this glass material is referred to as "Glass Material 1".

Next, in order to improve dimensional accuracy and shape accuracy, the rough grinding processing was performed on this glass substrate using alumina-based loose abrasive particles. This rough grinding processing was performed using a double-side grinding apparatus.

(2) Shape Processing

Next, a cylindrical grindstone was used to create a hole in the central portion of the glass substrate and an outer circumferential edge surface was ground to have a diameter of 65 mmø, whereafter predetermined chamfering was performed on the outer circumferential edge surface and an inner circumferential edge surface. In general, a magnetic disk having an outer diameter of 65 mm is used in a 2.5-inch HDD (hard disk drive).

(3) Precision Grinding Processing

This precision grinding processing was performed using a double-side grinding apparatus in which the glass substrate held by a carrier was tightly placed between the upper and lower surface plates to which pellets obtained by fixing diamond abrasive particles with a resin were attached, while a coolant was supplied. A roughness Ra of main surfaces of the substrate after the precision grinding processing was 100 nm or less. Note that the surface roughness after the precision grinding processing was measured using a stylus type roughness tester.

After undergoing the above-described precision grinding processing, the glass substrate was cleaned.

(4) Edge Surface Polishing Processing

Next, the edge surfaces (inner and outer circumferential edge surfaces) of the glass substrate were polished through brushing while the glass substrate was rotated. A roughness Ra of main surfaces of the substrate after the edge surface polishing processing was 100 nm or less. Then, after undergoing edge surface polishing above, the glass substrate was cleaned.

(5) Main Surface First Polishing Processing

Next, the first polishing processing for removing blemishes and warping remaining from the above-described grinding processing so as to achieve predetermined smooth surfaces was performed using the above-described double-side polishing apparatus shown in FIG. 3. In the double-side polishing apparatus, the glass substrate held by the carrier 4 is tightly placed between the upper and lower surface plates 5 and 6 to which the polishing pads 7 have been attached, the carrier 4 is engaged with the sun gear 2 and the internal gear 3, and the glass substrate is pressed by the upper and lower surface plates 5 and 6. Thereafter, a polishing liquid is supplied between the polishing pads and the glass substrate surfaces to be polished, the gears and the upper and lower surface plates are rotated, and thus the glass substrate revolves while rotating on the surface plates 5 and 6 so that both surfaces of the glass substrate are polished simultaneously due to the planetary gear mechanism. Specifically, the first polishing processing was performed using a suede polisher (made of polyurethane foam) having an Asker C hardness of 80, as the polisher (polishing pad).

An alkaline polishing liquid that had a pH of 10 and contained 10 wt % cerium oxide (having an average particle diameter of 1 μm) as polishing abrasive particles was used as the polishing liquid. Also, cerium oxide was reduced according to the above-described embodiment shown in FIG. 4. The glass tube (a quartz tube was used) 20 and the glass tube (a quartz tube was used) 21 were disposed to have a gap of about 2 mm, and this gap was filled with zirconia beads (having a diameter of 1.5 mm) with $TiO_2$ attached to the surfaces as a photocatalytic substance. The zirconia beads with $TiO_2$ attached to the surfaces were produced using the above-described manufacturing method. As a result of evaluation of the coverage of $TiO_2$ using the above-described evaluation method, the coverage of $TiO_2$ was 80%. An ultraviolet lamp (having a wavelength of 254 nm) was used as a light source (the light sources 24 and 25 shown in FIG. 4) to irradiate a polishing liquid with light. As a result of causing the polishing liquid to pass through the region filled with the above-described photocatalytic substance, cerium oxide included in the polishing liquid was reduced. The polishing liquid containing the cerium oxide abrasive particles reduced in this manner was supplied to the above-described polishing apparatus, and the above-described first polishing processing was performed.

Also, the polishing load was set to 120 g/cm$^2$ and the machining allowance was set to 30 μm in terms of the substrate thickness. A roughness Ra of the surfaces of the substrate after polishing was 1.5 nm or less. In the above-described first polishing processing, the polishing liquid was not replaced, the polishing liquid was used while the polishing liquid was collected and the collected polishing liquid was circulated, and 20 batches (100 substrates per batch) were continuously processed. After undergoing the above-described first polishing processing, the glass substrates were cleaned.

(6) Main Surface Second Polishing Processing

Next, the second polishing processing was performed using the same double-side polishing apparatus as used in the above-described first polishing processing, but polishing pads (made of polyurethane foam) with a soft polisher (suede type) having an Asker C hardness of 70 as the polisher were used instead. This second polishing processing is mirror-polishing processing for finishing the surface roughness of the main surfaces of the glass substrates into smooth mirror surfaces, for example, such that the surface roughness Ra of the main surfaces of the glass substrates is 0.2 nm or less and a surface roughness Rmax thereof is 2 nm or less. A polishing liquid containing 10 wt % colloidal silica (having an average particle diameter of 15 nm) as polishing abrasive particles was used as the polishing liquid. Note that the pH of the polishing liquid was adjusted to be acidic (pH=2) by adding sulfuric acid to the polishing liquid in advance. Also, the polishing load was set to 100 g/cm$^2$ and the machining allowance was set to 3 μm in terms of the substrate thickness.

Next, after undergoing the above-described second polishing processing, the glass substrates were subjected to cleaning processing (final cleaning processing).

Specifically, ultrasonic cleaning was performed by immersing the glass substrates into a cleaning tank in which an alkaline detergent was added to pure water. Thereafter, the glass substrates were sufficiently rinsed with pure water and then dried.

When the surface roughness (Ra) of the main surfaces of the glass substrates that were obtained through the above-described processes and after the above-described final cleaning processing was measured using an atomic force microscope (AFM), the glass substrates had smooth surfaces having an Ra of 0.2 nm or less and an Rmax of 2 nm or less.

Working Example 22 to 24

Glass substrates of Working Examples 22 to 24 were produced similarly to Working Example 21 except that the photocatalytic substance used to reduce cerium oxide in Working Example 21 above with $Ga_2O_3$, $Ta_2O_5$, and $LiNbO_3$ were used.

Comparative Example 5

A glass substrate of Comparative Example 5 was produced similarly to Working Example 21 except that the main surface first polishing processing in Working Example 21 was performed without reducing cerium oxide abrasive particles using a photocatalytic substance.

Reference Example 3

A glass substrate of Reference Example 3 was produced similarly to Working Example 21 except that a 1 wt % photocatalytic substance ($TiO_2$ having an average particle diameter of 100 nm) was added to the polishing liquid together with cerium oxide abrasive particles, without reducing cerium oxide before polishing processing as in Working Example 21, and the main surface first polishing processing was performed through light irradiation similarly to Working Example 1 in the first embodiment.

The polishing speeds in the above-described main surface first polishing processing of Working Examples 21 to 24, Comparative Example 5, and Reference Example 3 above were measured in the first batch, the relative ratios of the polishing speeds of the working examples (or the reference example) with respect to the polishing speed of Comparative Example 5 (the polishing speed of a working example (or reference example)/the polishing speed of Comparative Example 5) were calculated, and the results are collectively shown in Table 7 below.

Also, main surfaces of the glass substrates (5 glass substrates, 10 surfaces) of Working Examples 21 to 24, Comparative Example 5, and Reference Example 5 after the main surface first polishing processing and cleaning were inspected using a laser optical surface inspection device, and the number of pieces of foreign matter originating from the photocatalytic substance per surface of a substrate was measured. Results thereof are also shown in Table 7 below.

TABLE 7

| | Reduction Method using Photocatalytic Substance | Polishing Speed (Relative Ratio) | Number of Pieces of Foreign Matter Originating from Photocatalytic Substance on Substrate Surface (Relative Ratio) |
|---|---|---|---|
| Comp. Ex. 5 | photocatalyst was not used | 1.00 (Ref.) | — |
| Work. Ex. 21 | polishing liquid passed through region filled with $TiO_2$ attached beads | 1.08 | 0 |
| Work. Ex. 22 | polishing liquid passed through region filled with $Ga_2O_3$ attached beads | 1.16 | 0 |
| Work. Ex. 23 | polishing liquid passed through region filled with $Ta_2O_5$ attached beads | 1.18 | 0 |
| Work. Ex. 24 | polishing liquid passed through region filled with $LiNbO_3$ attached beads | 1.23 | 0 |
| Ref. Ex. 3 | Add $TiO_2$ to polishing liquid | 1.05 | 36 |

Based on the results of Table 7 above, the following was found.

1. According to the working examples of the present invention, as a result of performing polishing processing using cerium oxide abrasive particles reduced using the reducing method of the present invention, the polishing speed can be improved from the beginning with respect to the comparative example that does not contain the photocatalytic substance.

2. Also, from a comparison between the working examples of the present invention and the reference example, according to the present invention, it is possible to suppress the occurrence of defects resulting from foreign matter originating from the photocatalytic substance on the substrate surface.

Working Examples 25 to 28, Comparative Example 6, Reference Example 4

Similarly to Working Example 21 above, (1) rough grinding processing, (2) shape processing, and (3) precision grinding processing were performed sequentially, and then edge surface polishing processing below was performed. Note that Glass Material 1 above was used as the glass substrate.

The glass substrates resulting from the grinding processing above were stacked using a support jig to form a glass substrate stacked body. At that time, the glass substrate stacked body was formed by inserting resin spacers between glass substrates and placing 200 glass plates in total on one another.

The glass substrate stacked body formed in the above manner was inserted into a jig for outer circumferential edge surface polishing and the glass substrate stacked body was fixed by clamping the glass substrate stacked body vertically. The glass substrate stacked body was installed at a predetermined position of the outer circumferential edge surface polishing apparatus. The rotary brush for edge surface polishing was brought into contact with and pressed against the outer circumferential side edge surface of the glass substrate stacked body by a predetermined amount.

The polishing liquid was supplied to an outer circumferential edge surface portion of the glass substrate stacked body, the rotary brush and the glass substrate stacked body were rotated in opposite directions, and the glass substrate stacked body was polished while the rotary brush was swung in the direction in which the glass substrates were stacked.

The polishing liquid that was the same as that used in Working Examples 21 to 24, Comparative Example 5, and Reference Example 3 was used as the polishing liquid. That is, polishing processing was performed using the polishing liquid containing cerium oxide abrasive particles reduced using the method of the present invention in Working Example 25 to 28, using the polishing liquid containing cerium oxide abrasive particles without reduction using a photocatalytic substance in Comparative example 6, and using the polishing liquid to which a photocatalytic substance was added in Reference Example 4.

Note that in these working examples, comparative example, and reference example, the polishing liquid supply amount was set to 10 to 15 L/min, the rotation speed of the rotary brush was set to 300 rpm, the swing speed of the rotary brush in the support axial direction was set to 3 to 5 rpm (3 to 5 reciprocations per minute), and the rotation speed of the glass substrate stacked body was set to 80 to 90 rpm. The machining allowance was set to 40 µm in terms of the substrate thickness.

Also, the polishing liquid was not replaced in the working examples, the comparative example, and the reference example, and 20 batches were continuously processed while the polishing liquid was collected and the collected polishing liquid was circulated.

The polishing speeds in the above-described edge surface polishing processing of Working Examples 25 to 28, Comparative Example 6, and Reference Example 4 above were measured in the first batch, the relative ratios of the polishing speeds of the working examples (or the reference example) with respect to the polishing speed of Comparative Example 6 (the polishing speed of a working example (or reference example)/the polishing speed of Comparative Example 6) were calculated, and the results are collectively shown in Table 8 below.

Also, main surfaces of the glass substrates of Working Examples 25 to 28, Comparative Example 6, and Reference Example 4 after the edge surface polishing processing and cleaning were inspected using a laser optical surface inspection device, and the number of pieces of foreign matter originating from the photocatalytic substance on a main surface of a substrate was measured. The reason for evaluating the quality of the main surfaces is that foreign matter attached to an edge surface transfers to the main surfaces in a cleaning step. Results thereof are also shown in Table 8 below.

TABLE 8

| | Reduction Method using Photocatalytic Substance | Polishing Speed (Relative Ratio) | Number of Pieces of Foreign Matter Originating from Photocatalytic Substance on Substrate Surface (Relative Ratio) |
|---|---|---|---|
| Comp. Ex. 6 | photocatalyst was not used | 1.00 (Ref.) | — |

TABLE 8-continued

| | Reduction Method using Photocatalytic Substance | Polishing Speed (Relative Ratio) | Number of Pieces of Foreign Matter Originating from Photocatalytic Substance on Substrate Surface (Relative Ratio) |
|---|---|---|---|
| Work. Ex. 25 | polishing liquid passed through region filled with $TiO_2$ attached beads | 1.11 | 0 |
| Work. Ex. 26 | polishing liquid passed through region filled with $Ga_2O_3$ attached beads | 1.20 | 0 |
| Work. Ex. 27 | polishing liquid passed through region filled with $Ta_2O_5$ attached beads | 1.18 | 0 |
| Work. Ex. 28 | polishing liquid passed through region filled with $LiNbO_3$ attached beads | 1.31 | 0 |
| Ref. Ex. 4 | Add $TiO_2$ to polishing liquid | 1.05 | 28 |

Based on the results of Table 8 above, the following was found.

1. In the substrate edge surface polishing processing, according to the working examples of the present invention, as a result of performing polishing processing using cerium oxide abrasive particles reduced using the reducing method of the present invention, the polishing speed can also be improved from the beginning with respect to the comparative example that does not contain the photocatalytic substance.

2. Also, from a comparison between the working examples of the present invention and the reference example, according to the present invention, it is possible to suppress the occurrence of defects resulting from foreign matter originating from the photocatalytic substance on the substrate surface.

(Manufacturing of Magnetic Disk)

A magnetic disk for perpendicular magnetic recording was obtained by performing the following film formation steps on the magnetic-disk glass substrate that was obtained in Working Example 21 above.

That is, an adherent layer constituted by a CrTi-based alloy thin film, a soft magnetic layer constituted by a CoTaZr alloy thin film, a seed layer constituted by NiW, a base layer constituted by a Ru thin film, a perpendicular magnetic recording layer made of a CoCrPt-based alloy, a carbon protective layer, and a lubricant layer were sequentially formed on the above-described glass substrate. The protective layer is for preventing degradation of the magnetic recording layer caused by contact with the magnetic head, and the protective layer is composed of hydrogenated carbon and yields wear resistance. Also, the lubricant layer was formed using a dipping method using an alcohol-modified perfluoropolyether liquid lubricant.

When the obtained magnetic disk was incorporated into an HDD equipped with a DFH head, and a load and unload durability test was performed for one month while the DFH function was operated under a high temperature and high humidity environment having a temperature of 80° C. and a RH of 80%, there was no failure and a good result was obtained. Note that similar results were obtained also in the case where the magnetic-disk glass substrates that were obtained in the other working examples were used.

Aspect (Aspect 1)

A method for polishing a glass substrate, by which a glass substrate is subjected to polishing processing using a polishing liquid containing cerium oxide as polishing abrasive particles, in which the polishing liquid contains a substance that reduces cerium oxide in response to light irradiation, and the method includes processing for irradiating the polishing liquid with light when performing the polishing processing.

(Aspect 2)

The method for polishing a glass substrate according to Aspect 1, in which a band gap of the substance that reduces cerium oxide in response to light irradiation is larger than a band gap of the cerium oxide.

(Aspect 3)

The method for polishing a glass substrate according to Aspect 1 or 2, in which an energy level at a lower end of a conduction band of the substance that reduces cerium oxide in response to light irradiation is higher than an energy level at a lower end of a conduction band of the cerium oxide.

(Aspect 4)

The method for polishing a glass substrate according to any of Aspects 1 to 3, in which the substance that reduces cerium oxide in response to light irradiation includes at least one of gallium oxide, tantalum oxide, tantalates, niobium oxide, and niobates.

(Aspect 5)

The method for polishing a glass substrate according to any of Aspects 1 to 4, in which the polishing liquid is alkaline.

(Aspect 6)

The method for polishing a glass substrate according to any of Aspects 1 to 5, in which the polishing liquid is used while the polishing liquid is circulated during the polishing processing.

(Aspect 7)

A method for manufacturing a glass substrate, including processing in which a surface of a glass substrate is polished using the method for polishing a glass substrate according to any of Aspects 1 to 6.

(Aspect 8)

A method for manufacturing a magnetic-disk glass substrate, by which a magnetic-disk glass substrate is manufactured using the method for manufacturing a glass substrate according to Aspect 7.

(Aspect 9)

A method for manufacturing a magnetic disk, including processing in which a surface of a glass substrate is polished using the method for polishing a glass substrate according to any of Aspects 1 to 6, and processing in which at least a magnetic film is formed.

(Aspect 10)

A polishing liquid for polishing a glass substrate, in which the polishing liquid includes cerium oxide as polishing abrasive particles and a substance that reduces cerium oxide in response to light irradiation.

(Aspect 11)

A method for polishing a glass substrate, by which a glass substrate is subjected to polishing processing using a polishing liquid containing polishing abrasive particles, in which the polishing abrasive particles include cerium oxide whose surface has a substance that reduces cerium oxide in response to light irradiation, and the method includes processing for irradiating the polishing liquid with light when performing the polishing processing.

(Aspect 12)

The method for polishing a glass substrate according to Aspect 11, in which a band gap of the substance that reduces cerium oxide in response to light irradiation is larger than a band gap of the cerium oxide.

(Aspect 13)

The method for polishing a glass substrate according to Aspect 11 or 12, in which an energy level at a lower end of a conduction band of the substance that reduces cerium oxide in response to light irradiation is higher than an energy level at a lower end of a conduction band of the cerium oxide.

(Aspect 14)

The method for polishing a glass substrate according to any of Aspects 11 to 13, in which the substance that reduces cerium oxide in response to light irradiation includes at least one of gallium oxide, tantalum oxide, niobium oxide, and niobates.

(Aspect 15)

The method for polishing a glass substrate according to any of Aspects 11 to 14, in which a coverage of the substance that reduces cerium oxide in response to light irradiation on the surface of the cerium oxide is in a range of 0.01% to 50%.

(Aspect 16)

The method for polishing a glass substrate according to any of Aspects 11 to 15, in which the polishing liquid is alkaline.

(Aspect 17)

The method for polishing a glass substrate according to any of Aspects 11 to 16, in which the polishing liquid is used while the polishing liquid is circulated during the polishing processing.

(Aspect 18)

A method for manufacturing a glass substrate, including processing in which a surface of a glass substrate is polished using the method for polishing a glass substrate according to any of Aspects 11 to 17.

(Aspect 19)

A method for manufacturing a magnetic-disk glass substrate, by which a magnetic-disk glass substrate is manufactured using the method for manufacturing a glass substrate according to Aspect 18.

(Aspect 20)

A method for manufacturing a magnetic disk, including processing in which a surface of a glass substrate is polished using the method for polishing a glass substrate according to any of Aspects 11 to 17, and processing in which at least a magnetic film is formed.

(Aspect 21)

A polishing liquid for polishing a glass substrate, in which the polishing liquid includes, as polishing abrasive particles, cerium oxide whose surface has a substance that reduces cerium oxide in response to light irradiation.

(Aspect 22)

A method for reducing cerium oxide included as polishing abrasive particles in a polishing liquid to be used when processing for polishing a glass substrate is performed, in which, as a result of the polishing liquid containing the cerium oxide passing through a region in which a substance that reduces cerium oxide in response to light irradiation is fixed and in which the substance that reduces cerium oxide is irradiated with light, the cerium oxide is reduced.

(Aspect 23)

The method for reducing cerium oxide according to Aspect 22, in which carrier particles whose surfaces have the substance that reduces cerium oxide in response to light irradiation are fixed in the region.

(Aspect 24)

The method for reducing cerium oxide according to Aspect 23, in which a coverage of the substance that reduces cerium oxide in response to light irradiation on the surfaces of the carrier particles is 30% or more.

(Aspect 25)

The method for reducing cerium oxide according to any of Aspects 22 to 24, in which a band gap of the substance that reduces cerium oxide in response to light irradiation is larger than a band gap of the cerium oxide.

(Aspect 26)

The method for reducing cerium oxide according to any of Aspects 22 to 25, in which an energy level at a lower end of a conduction band of the substance that reduces cerium oxide in response to light irradiation is higher than an energy level at a lower end of a conduction band of the cerium oxide.

(Aspect 27)

The method for reducing cerium oxide according to any of Aspects 22 to 26, in which the substance that reduces cerium oxide in response to light irradiation includes at least one of gallium oxide, tantalum oxide, tantalates, niobium oxide, and niobates.

(Aspect 28)

A method for polishing a glass substrate, by which a glass substrate is subjected to polishing processing using the polishing liquid containing cerium oxide that has been reduced using the method for reducing cerium oxide according to any of Aspects 22 to 27.

(Aspect 29)

The method for polishing a glass substrate according to Aspect 28, in which the polishing liquid is alkaline.

(Aspect 30)

The method for polishing a glass substrate according to Aspect 28 or 29, in which the polishing liquid is used while the polishing liquid is circulated during the polishing processing.

(Aspect 31)

A method for manufacturing a glass substrate, including processing in which a surface of a glass substrate is polished using the method for polishing a glass substrate according to any of Aspects 28 to 30.

(Aspect 32)

A method for manufacturing a magnetic-disk glass substrate, by which a magnetic-disk glass substrate is manufactured using the method for manufacturing a glass substrate according to Aspect 31.

(Aspect 33)

A method for manufacturing a magnetic disk, including processing in which a surface of a glass substrate is polished using the method for polishing a glass substrate according to any of Aspects 28 to 30, and processing in which at least a magnetic film is formed.

According to the aspect, it is possible to provide a method for polishing a glass substrate, by which a polishing speed that is higher than a conventional polishing speed can be achieved in processing for polishing a glass substrate using cerium oxide as polishing abrasive particles, and such a high polishing speed can be maintained for a long time of period. Also, it is possible to provide a method for manufacturing a glass substrate, by which a high-quality glass substrate can be obtained using such a method for polishing a glass substrate. Also, in particular, the method for polishing a glass substrate according to the aspect is suitable for manufacturing a magnetic-disk glass substrate. Also, the polishing liquid according to the aspect is suitable for the above-described method for polishing a glass substrate.

Also, according to the aspect, it is possible to provide a method for reducing cerium oxide, by which cerium oxide included, as polishing abrasive particles, in a polishing liquid used when processing for polishing a glass substrate is performed can be efficiently reduced. Furthermore, it is possible to provide a method for polishing a glass substrate, by which performing processing for polishing a glass substrate using a polishing liquid containing cerium oxide reduced using such a method for reducing cerium oxide results in being able to achieve a polishing speed that is higher than a conventional polishing speed, and such a high polishing speed can be maintained for a long period of time. Also, when the method for reducing cerium oxide according to the aspect is used, the polishing liquid does not contain a photocatalytic substance, and thus it is possible to keep foreign matter originating from a photocatalytic substance from attaching to a substrate surface that has undergone polishing processing and cleaning processing.

Also, even in the case where the magnetic-disk glass substrate obtained using the method for manufacturing a glass substrate of the aspect is used in combination with a magnetic head that is provided with a DFH (Dynamic Flying Height) function and is designed to have a very low flying height, a highly reliable magnetic disk that is capable of performing stable operations for a long period of time can be obtained.

The invention claimed is:

1. A polishing liquid for polishing a glass substrate, the polishing liquid comprising:
    as polishing abrasive particles, a particle including a cerium oxide particle and a substance for reducing cerium oxide in response to irradiation of light which are integrally formed in a state in which the substance for reducing cerium oxide in response to the irradiation of the light is in contact with a surface of the cerium oxide particle,
    the substance for reducing cerium oxide in response to the irradiation of the light being gallium oxide.

2. The polishing liquid according to claim 1,
    wherein a band gap of the substance for reducing cerium oxide in response to the irradiation of the light is larger than a band gap of the cerium oxide particle.

3. The polishing liquid according to claim 1,
    wherein an energy level at a lower end of a conduction band of the substance for reducing cerium oxide in response to the irradiation of the light is higher than an energy level at a lower end of a conduction band of the cerium oxide particle.

4. The polishing liquid according to claim 1,
    wherein a coverage indicating to what extent the substance for reducing cerium oxide in response to the irradiation of the light covers the surface of the cerium oxide particle is in a range of 0.01% to 50%.

5. The polishing liquid according to claim 1,
    wherein the polishing liquid is alkaline.

6. A polishing liquid for polishing a glass substrate, the polishing liquid comprising:
    cerium oxide as polishing abrasive particles; and
    a substance for reducing cerium oxide in response to irradiation of light,
    an average particle diameter of the substance for reducing cerium oxide in response to the irradiation of the light being $1/5$ or less of an average particle diameter of the cerium oxide,
    a content of the substance for reducing cerium oxide in response to the irradiation of the light being half or less of a content of the cerium oxide in the polishing liquid, and
    the substance for reducing cerium oxide in response to the irradiation of the light being gallium oxide.

7. The polishing liquid according to claim 6,
    wherein a band gap of the substance for reducing cerium oxide in response to the irradiation of the light is larger than a band gap of the cerium oxide.

8. The polishing liquid according to claim 6,
    wherein an energy level at a lower end of a conduction band of the substance for reducing cerium oxide in response to the irradiation of the light is higher than an energy level at a lower end of a conduction band of the cerium oxide.

9. The polishing liquid according to claim 6, wherein the polishing liquid is alkaline.

* * * * *